(12) United States Patent
Shintani

(10) Patent No.: US 8,593,563 B2
(45) Date of Patent: Nov. 26, 2013

(54) IMAGING DEVICE AND IMAGING APPARATUS INCLUDING THE SAME

(75) Inventor: Dai Shintani, Osaka (JP)

(73) Assignee: Panasonic Corporation, Osaka (JP)

( * ) Notice: Subject to any disclaimer, the term of this patent is extended or adjusted under 35 U.S.C. 154(b) by 31 days.

(21) Appl. No.: 13/202,869

(22) PCT Filed: Feb. 2, 2010

(86) PCT No.: PCT/JP2010/000613
§ 371 (c)(1),
(2), (4) Date: Aug. 23, 2011

(87) PCT Pub. No.: WO2010/095374
PCT Pub. Date: Aug. 26, 2010

(65) Prior Publication Data
US 2011/0304753 A1 Dec. 15, 2011

(30) Foreign Application Priority Data

Feb. 23, 2009 (JP) ................... 2009-039828

(51) Int. Cl.
*H04N 3/14* (2006.01)
*H04N 5/232* (2006.01)
(52) U.S. Cl.
USPC .......................................... 348/349; 348/272
(58) Field of Classification Search
USPC ........................ 348/266–280, 345, 349, 353
See application file for complete search history.

(56) References Cited

U.S. PATENT DOCUMENTS

| 7,595,475 B2 * | 9/2009 | Taniguchi ................. 250/208.1 |
| 2008/0068477 A1 | 3/2008 | Iida et al. |
| 2009/0322918 A1 | 12/2009 | Shintani |

FOREIGN PATENT DOCUMENTS

| JP | 2001-036807 | 2/2001 |
| JP | 2006-005500 | 1/2006 |
| JP | 2007-329380 | 12/2007 |
| JP | 2008-78922 | 4/2008 |
| JP | 2008-227250 | 9/2008 |
| WO | WO 2009/022458 A1 | 2/2009 |

* cited by examiner

*Primary Examiner* — Timothy J Henn
(74) *Attorney, Agent, or Firm* — McDermott Will & Emery LLP

(57) ABSTRACT

The present disclosure provides an imaging device in which an additional member for switching an installation state of an IR cut filter does not have to be provided and which can flexibly use infrared light.

An imaging device (1) receives light and performs photoelectric conversion. The imaging device (1) includes a first photoelectric conversion portion (10) configured to receive light including infrared light and allow the light to pass therethrough, second filters (26) configured to filter infrared light from the light which has passed through the first photoelectric conversion portion (10), and a second photoelectric conversion portion (20) configured to receive light transmitted through the second filters (26).

7 Claims, 14 Drawing Sheets

FIG.6
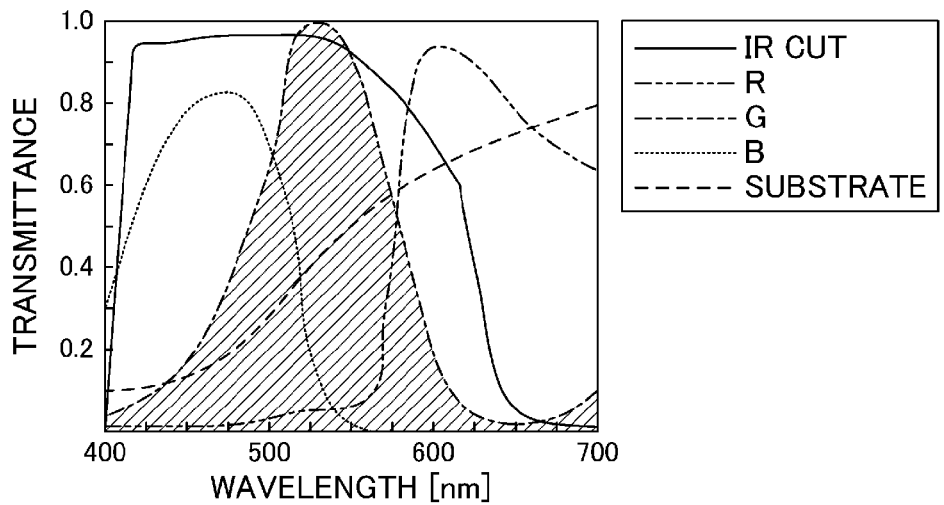
(A)
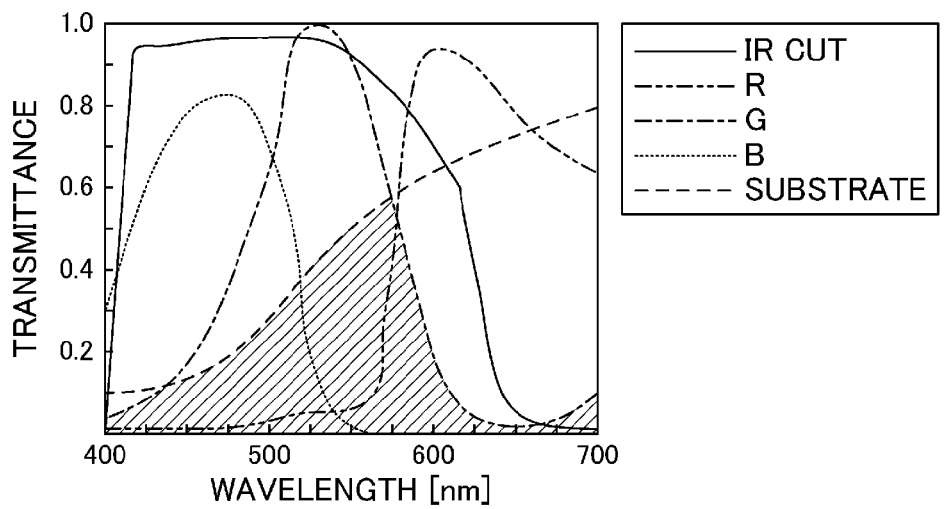
(B)
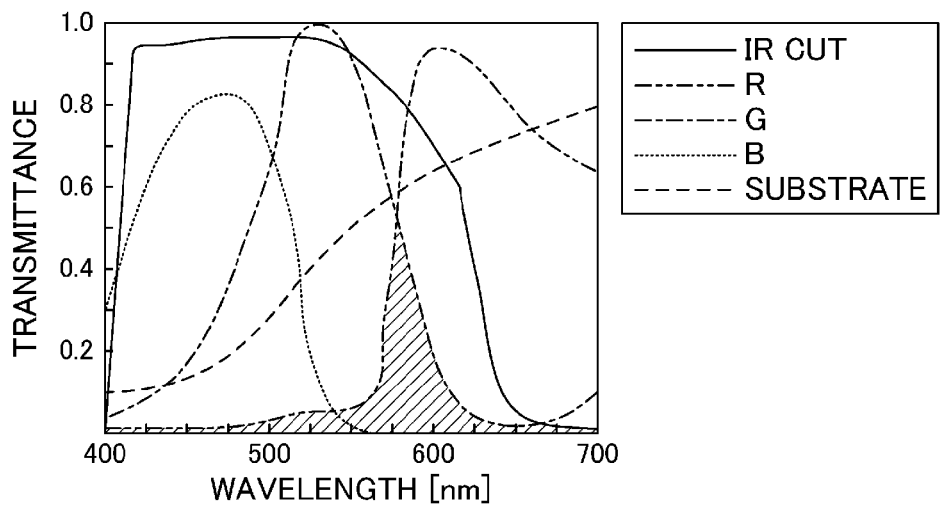
(C)

FIG.7
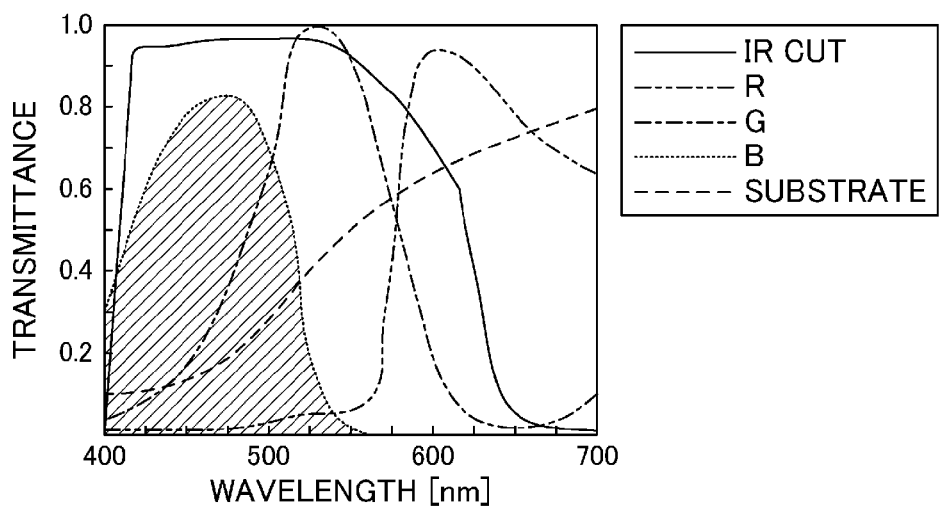
(A)
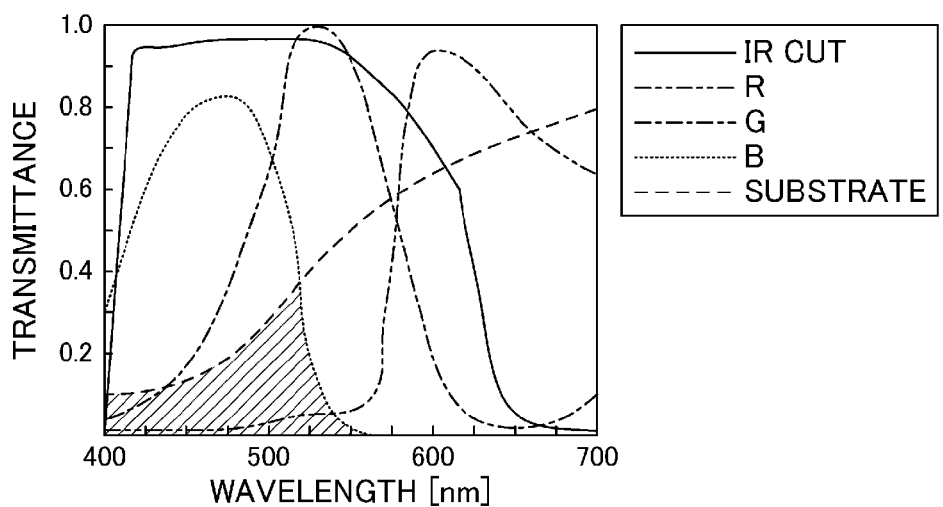
(B)
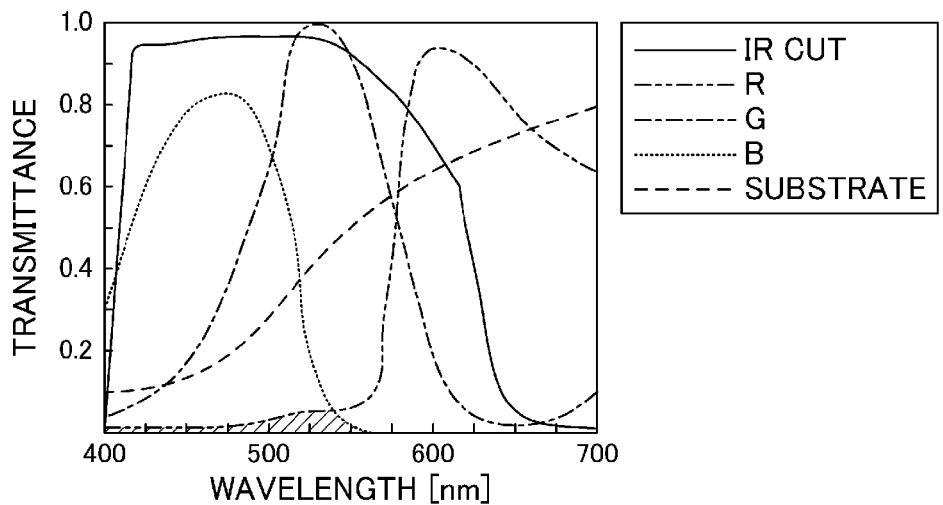
(C)

FIG.8
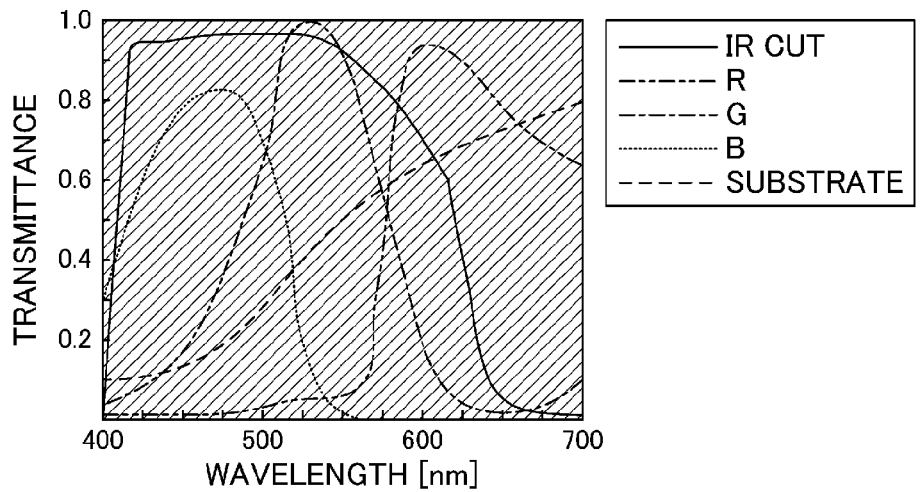
(A)
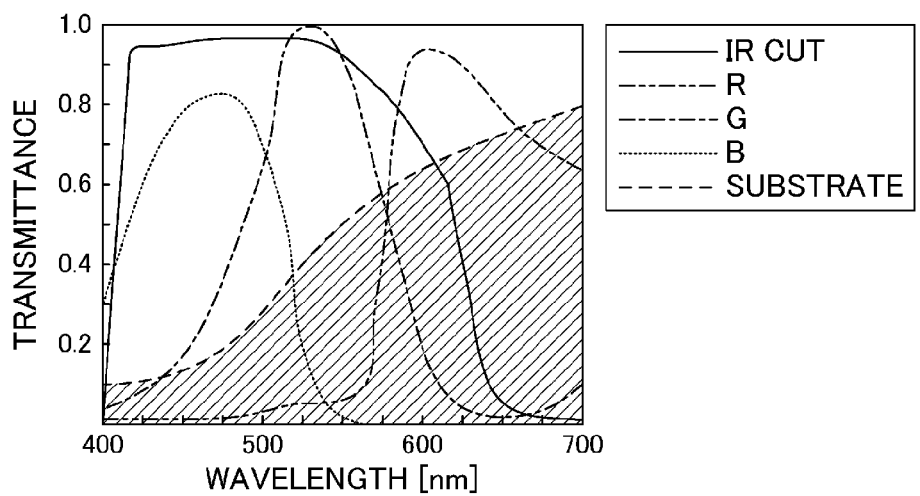
(B)
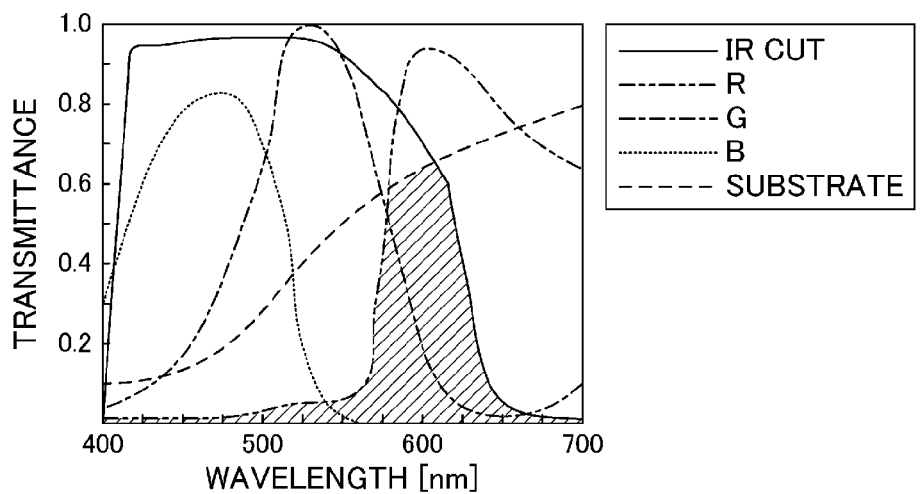
(C)

IMAGING DEVICE AND IMAGING APPARATUS INCLUDING THE SAME

RELATED APPLICATIONS

This application is the U.S. National Phase under 35 U.S.C. §371 of International Application No. PCT/JP2010/000613, filed on Feb. 2, 2010, which in turn claims the benefit of Japanese Application No. 2009-039828, filed on Feb. 23, 2009, the disclosures of which Applications are incorporated by reference herein.

TECHNICAL FIELD

The present disclosure relates to an imaging device which receives light and performs photoelectric conversion, and an imaging apparatus including the imaging device.

BACKGROUND ART

Conventionally, imaging devices, such as a charge coupled device (CCD), and a complementary metal-oxide semiconductor (CMOS), etc. that convert received light into an electrical signal by performing photoelectric conversion have been known.

In general, in such an imaging device, to adjust color reproducibility to a level that matches a luminosity of the human eye, an infrared cut filter (i.e., so-called IR cut filter) is provided to be located in front of the imaging device, thereby removing infrared light from light entering the imaging device.

However, as in security cameras, there are cases in which sensitivity is considered more important than color reproducibility, and in such a case, light including infrared light has to be received by an imaging device.

Thus, to satisfy both of the above-described conditions, an imaging device according to PATENT DOCUMENT 1 is configured so that an IR cut filter is installed in front of the imaging device according to the amount of light. Specifically, an IR cut filter is attached to an aperture, and when the amount of light entering the imaging device is small, the IP cut filter is moved to an evacuation position in conjunction with releasing of the aperture. On the other hand, when the amount of light entering the imaging device is large, the IR cut filter is moved back to be installed in front of the imaging device in conjunction with stopping of the aperture down to a predetermined aperture value.

CITATION LIST

Patent Document

PATENT DOCUMENT 1: Japanese Patent Application No. 2001-36807

SUMMARY OF THE INVENTION

Technical Problem

However, in the configuration in which the position of the IR cut filter is selectively switched between an installation position and an evacuation position, when the IR cut filter is installed, imaging with high color reproducibility can be performed, but the sensitivity is degraded. When the IR cut filter is moved to the evacuation position, imaging with high sensitivity can be performed, but the color reproducibility is degraded. That is, one of the color reproducibility and the selectivity is selected to perform imaging.

Furthermore, when switching of the position of the IR cut filter between the installation position and the evacuation position in conjunction with some other member, infrared light cannot be used independently from the operation of the member. For example, in the imaging device of PATENT DOCUMENT 1, it is only when the aperture is released that the imaging device receives infrared light. When the aperture is stopped down from a released state even a little, the IR cut filter is installed in front of the imaging device, so that the imaging device cannot receive infrared light.

Thus, to allow use of infrared light independently from the operation of some other member, an installation state of the IR cut filter may be switched by a mechanism specifically provided for the switching. However, in such a configuration, the number of members is increased, and the configuration becomes complicated. Therefore, switching of the installation state of the IR cut filter using such a mechanism is not preferable.

In view of the above-described points, the present disclosure has been made. It is therefore an object of the present disclosure to provide an imaging device in which an additional member for switching the installation state of the IR cut filter does not have to be provided and which can flexibly use infrared light.

Solution to the Problem

The present disclosure is directed to an imaging device which receives light and performs photoelectric conversion. The imaging device includes a first photoelectric conversion portion configured to receive light including infrared light and allow the light to pass therethrough, and a second photoelectric conversion portion configured to receive light obtained by filtering infrared light from the light which has passed through the first photoelectric conversion portion.

Advantages of the Invention

In the imaging device, the first photoelectric conversion portion is configured to allow light to pass therethrough, light including infrared light is received by the first photoelectric conversion portion, and light obtained by removing infrared light from the light which has passed through the first photoelectric conversion portion is received by the second photoelectric conversion portion. Thus, infrared light can be received by the first photoelectric conversion portion, so that imaging can be performed while flexibly using infrared light. In addition, the second photoelectric can receive light from which the infrared light has been removed, and thus, an image with high color reproducibility can be obtained by using at least light received by the second photoelectric conversion portion.

BRIEF DESCRIPTION OF THE DRAWINGS

FIG. 6 includes graphs showing spectral characteristics of filters and photoelectric conversion portions in pixels corresponding to green color filters.
FIG. 6(A) is a graph showing spectral characteristics of a first filter.
FIG. 6(B) is a graph showing spectral characteristics of a first photoelectric conversion portion 10.
FIG. 6(C) is a graph showing a second filter.

FIG. 7 includes graphs showing spectral characteristics of filters and a substrate in pixels corresponding to blue color filters. FIG. 7(A) is a graph showing spectral characteristics of a first filter. FIG. 7(B) is a graph showing spectral characteristics of a first photoelectric conversion portion 10. FIG. 7(C) is a graph showing a second filter.

FIG. 8 includes graphs showing spectral characteristics of filters and a substrate in pixels corresponding to white filters. FIG. 8(A) is a graph showing spectral characteristics of a first filter. FIG. 8(B) is a graph showing spectral characteristics of a first photoelectric conversion portion 10. FIG. 8(C) is a graph showing a second filter.

FIG. 10(A) is a graph showing spectral characteristics of a first filter. FIG. 10(B) is a graph showing spectral characteristics of a first photoelectric conversion portion 10. FIG. 10(C) is a graph showing a second filter.

DESCRIPTION OF EMBODIMENTS

Embodiments of the present invention will be described hereinafter in detail with reference to the accompanying drawings.

First Embodiment

Figure 1:
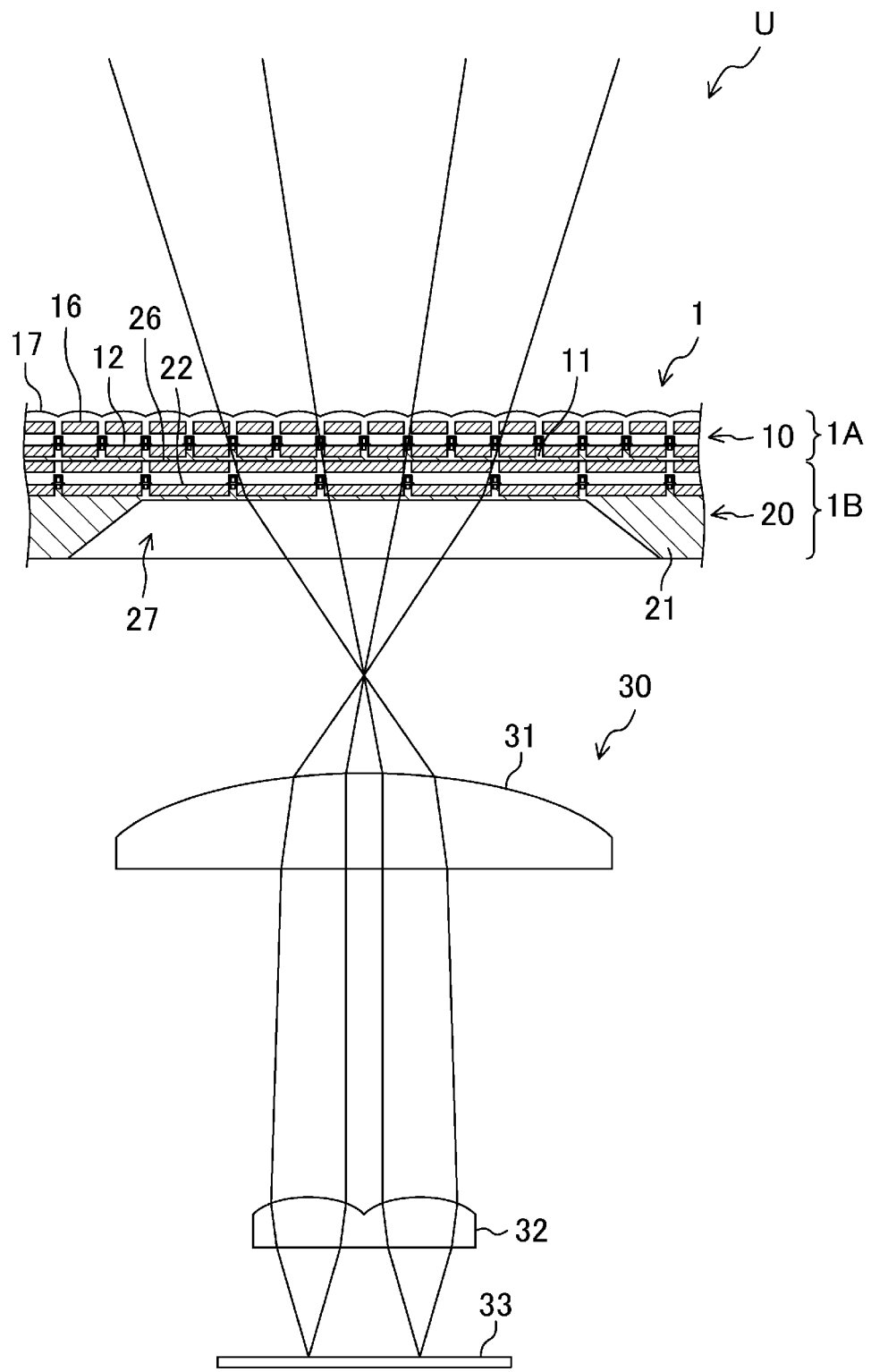
FIG. 1 is a schematic cross-sectional view of an imaging unit according to a first embodiment of the present invention.

FIG. 1 is a schematic cross-sectional view of an imaging unit U according to a first embodiment of the present invention. The imaging unit U includes an imaging device 1 for converting an object image into an electric signal, and a phase difference detection unit 30 for performing phase difference detection-type focus detection. The imaging unit U forms an imaging device.

Figure 2:
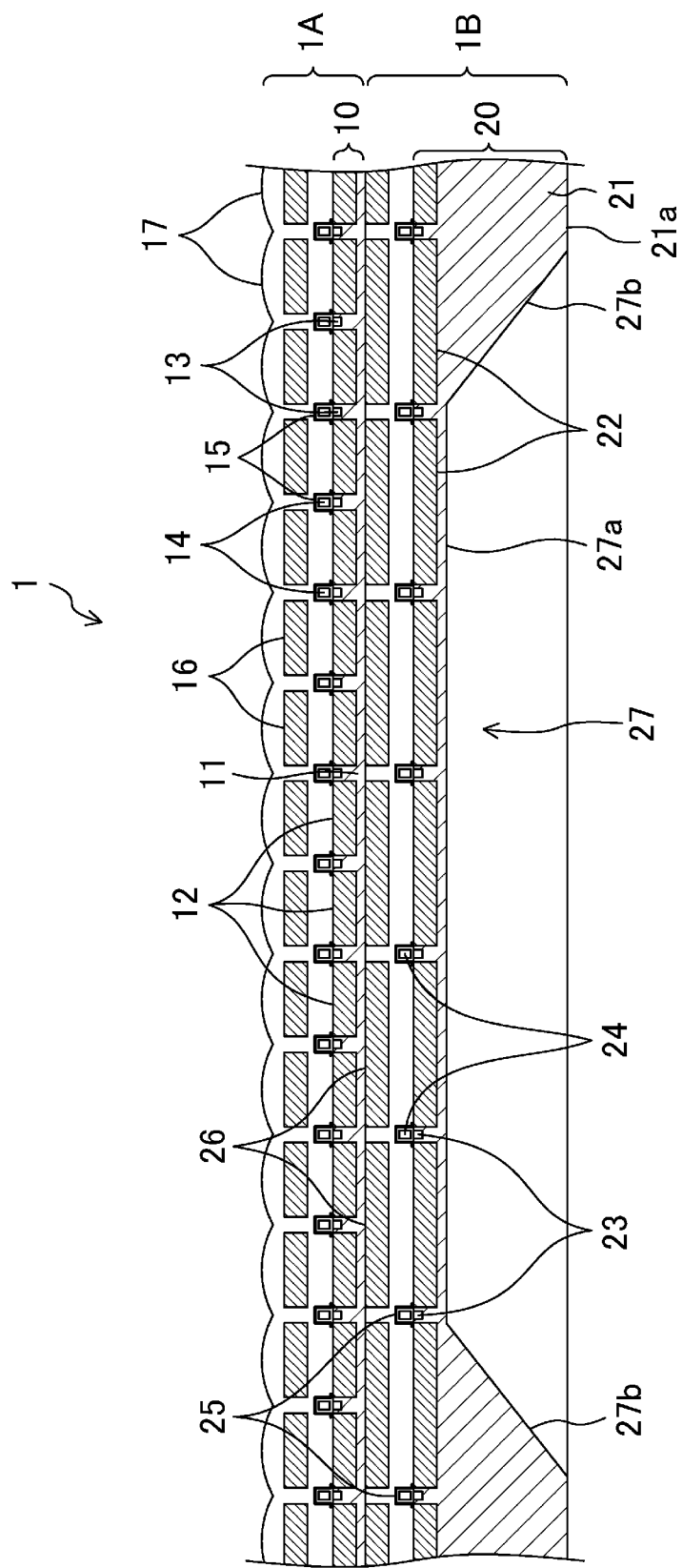
FIG. 2 is a schematic end view of an imaging device.
Figure 3:
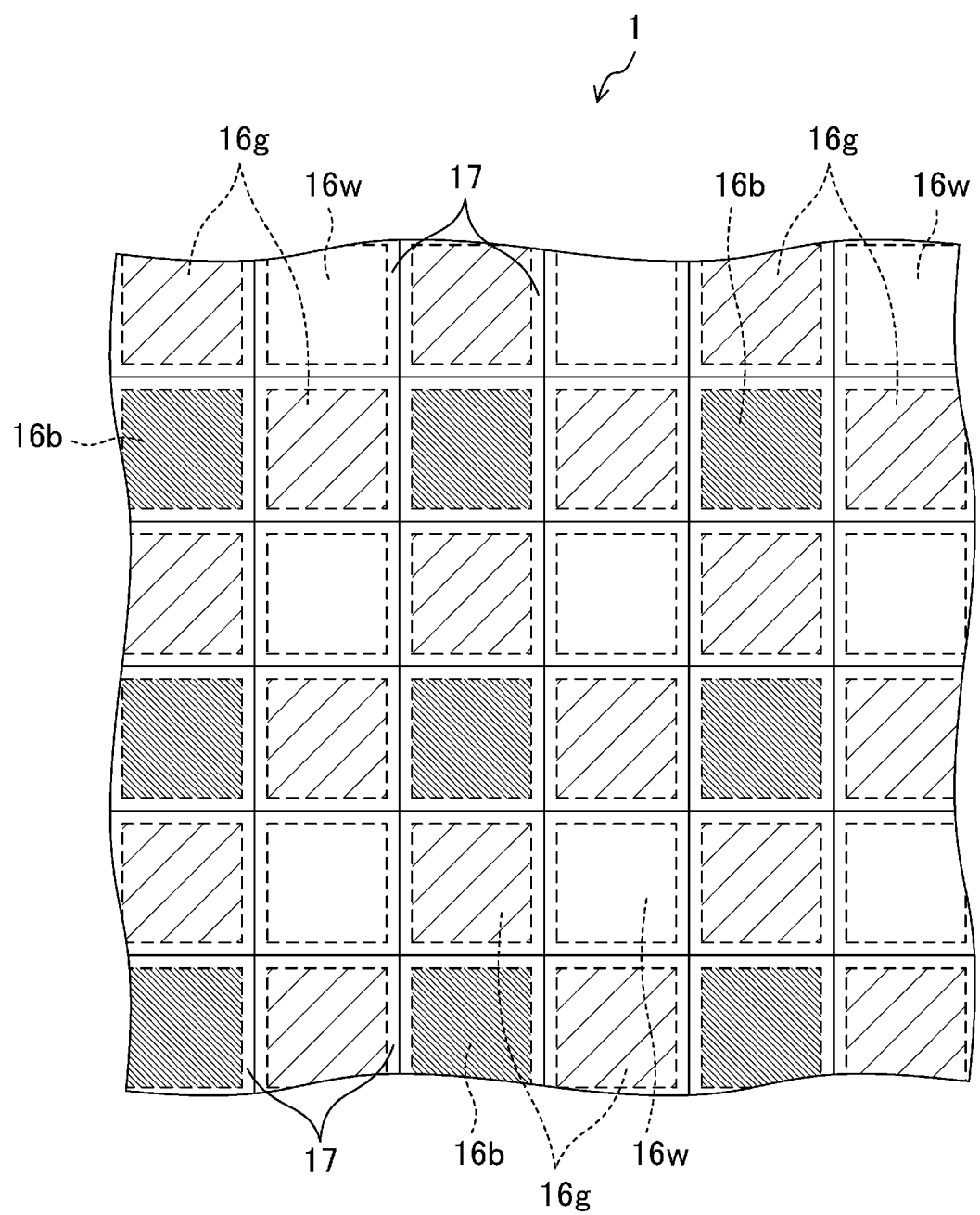
FIG. 3 is a schematic plan view of an imaging device.
Figure 4:
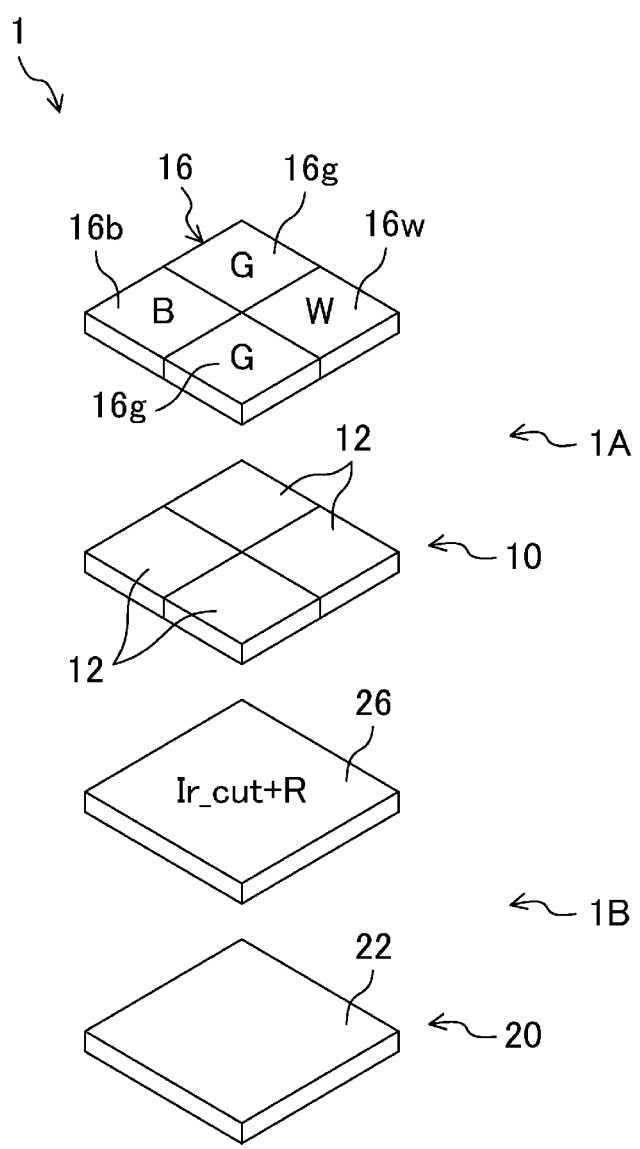
FIG. 4 is a schematic exploded perspective view of the imaging device.

FIG. 2 is a schematic cross-sectional view of an imaging device, FIG. 3 is a schematic plan view of the imaging device, and FIG. 4 is a schematic exploded perspective view of the imaging device. The imaging device 1 is an interline CCD image sensor, and includes a first imaging portion 1A and a second imaging portion 1B which are stacked.

The first imaging portion 1A includes a first photoelectric conversion portion 10 made of a semiconductor material, first vertical resisters 13, first transfer paths 14, first masks 15, first filters 16, and first microlenses 17. The second imaging portion 1B includes a second photoelectric conversion portion 20 made of a semiconductor material, second vertical resisters 23, second transfer paths 24, second masks 25, and second filters 26.

First, the first imaging portion 1A will be described.

The first photoelectric conversion portion 10 includes a substrate 11, and a plurality of light receiving portions (also referred to as "pixels") 12, 12, . . . , arranged on the substrate 11.

The substrate 11 is formed of a Si (silicon) based substrate. Specifically, the substrate 11 is a Si single crystal substrate or a SOI (silicon-on-insulator wafer). In particular, a SOI substrate has a sandwich structure of a $SiO_2$ thin film and Si thin films, and chemical reaction can be stopped at the $SiO_2$ layer in etching or like processing. Thus, in terms of performing stable substrate processing, it is advantageous to use an SOI substrate.

Each of the light receiving portions 12 is made of a photodiode, and absorbs light to generate electrical charge. The light receiving portions 12, 12, . . . are provided respectively in micro pixel regions each having a square shape, arranged in matrix on the substrate 11.

The first vertical resister 13 is provided for each light receiving portion 12, and serves to temporarily store electrical charge stored in the light receiving portion 12. That is, the electrical charge stored in the light receiving portion 12 is transferred to the first vertical resister 13. The electrical charge transferred to the first vertical resister 13 is transferred to a horizontal register (not shown) via the first transfer path 14, and then, to an amplifier (not shown). The electrical charge transferred to the amplifier is amplified and pulled out as an electrical signal.

The first mask 15 is provided so that the light receiving portion 12 is exposed toward an object and the first vertical resister 13 and the first transfer path 14 are covered by the first mask 15 to prevent light from entering the first vertical resister 13 and the first transfer path 14.

The first filter 16 and the first microlens 17 are provided in each micro pixel region having a square shape so as to correspond to an associated one of the light receiving portions 12. Each of the first filters 16 transmits only a specific color, and primary color filters or complementary color filters are used as the color filters 16. In this embodiment, as shown in FIGS. 2 and 3, primary color filters including a plurality of color filters 16g, 16b, 16w, . . . arranged in a matrix pattern are used. That is, assuming that four color filters 16 arranged adjacent to one another in two rows and two columns (or in four pixel regions) are a repeat unit throughout the entire imaging device 10, two green color filters (i.e., color filters having a higher transmittance in a green visible light wavelength range than in the other color visible light wavelength ranges) 16g, 16g are arranged in a diagonal direction, and a blue color filter (i.e., a color filter having a higher transmittance in a blue visible light wavelength range than in the other color visible light wavelength ranges) 16b and a white color filter (i.e., a color filter which transmits at least light in the visible wavelength range and the infrared wavelength range while hardly attenuating the light) 16w are arranged in another diagonal direction. When the entire set of the color filters 16 is viewed, every second color filters in the row and column directions is the green color filter 16g.

The microlenses 17 collect light to cause the light to enter the light receiving portions 12. The light receiving portions 12 can be efficiently irradiated with light by the microlens 17.

The first photoelectric conversion portion 10 is formed to have a thickness with which incident light is transmitted through the first photoelectric conversion portion 10. That is, the first photoelectric conversion portion 10 is configured so that light which has entered the light receiving portion 12 is transmitted through the light receiving portion 12, and further through the substrate 11.

Next, the second imaging portion 1B will be described.

The second photoelectric conversion portion 20 includes a substrate 21, and a plurality of light receiving portions (also referred to as "pixels") 22, 22, . . . , arranged on the substrate 21.

The substrate 21 is formed of a Si (silicon) based substrate. Specifically, the substrate 21 is a Si single crystal substrate or a SOI (Silicon On Insulator wafer). In particular, a SOI substrate has a sandwich structure of a Si thin film and SiO$_2$ thin films, and chemical reaction can be stopped at the SiO$_2$ layer in an etching, or like processing. Thus, in terms of performing stable substrate processing, it is advantageous to use an SOI substrate.

Each of the light receiving portions 22 is made of a photodiode, absorbs light to generate electrical charge. The light receiving portions 22, 22, . . . are provided respectively in micro pixel regions each having a square shape, arranged in matrix on the substrate 21.

The second vertical register 23 is provided for each light receiving portion 22, and serves to temporarily store the electrical charge stored in the light receiving portion 22. That is, the electrical charge stored in the light receiving portion 22 is transferred to the second vertical register 23. The electrical charge transferred to the second vertical register 23 is transferred to a horizontal register (not shown) via the second transfer path 24, and then, to an amplifier (not shown). The electrical charge transferred to the amplifier is amplified and pulled out as an electric signal.

The second mask 25 is provided so that the light receiving portion 22 is exposed toward an object and the second vertical resister 23 and the second transfer path 24 are covered by the second mask 25 to prevent light from entering the second vertical resister 23 and the second transfer path 24.

The second filter 26 is provided in each micro pixel region having a square shape so that the second filters 26 respectively correspond to the light receiving portions 22 and are arranged in a matrix. The second filters 26 are infrared cut filters (i.e., so-called IR cut filter) each of which removes infrared light, and also functions as a color filter (i.e., a color filter having a higher transmittance in a red visible wavelength range than in the other color visible wavelength ranges) which transmits only red light. That is, the second filter 26 transmits light in a partial range of a red visible wavelength range, which is shorter than the infrared wavelength range.

The pixel pitch of the second photoelectric conversion portion 20 (i.e., the pitch of the light receiving portion 22) is set to be twice as large as the pixel pitch of the first photoelectric conversion portion 10 (i.e., the pitch of the light receiving portions 12). That is, the area of each pixel 22 of the second photoelectric conversion portion 20 is about four times as large as the area of each pixel 12 of the first photoelectric conversion portion 10. Accordingly, the area of each second filter 26 is set to be about four times as large as the area of each first filter 16.

A plurality of light transmitting portions 27 for transmitting irradiation light are formed in the substrate 21 of the second photoelectric conversion portion 20 (only one light transmitting portion 27 is shown in FIGS. 1 and 2). The light transmitting portions 27 are formed by cutting, polishing or etching an opposite surface (hereinafter also referred to as a "back surface") 21a of the substrate 21 to a surface thereof on which the light receiving portions 22 are provided to provide concave-shaped recesses, and each of the light transmitting portions 27 has a smaller thickness than that of part of the substrate 21 around each of the light transmitting portions 27. More specifically, each of the light transmitting portions 27 includes a recess-bottom surface 27a having a smallest thickness and inclined surfaces 27b for connecting the recess-bottom surface 27a with the back surface 21a.

Each of the light transmitting portions 27 in the substrate 21 is formed to have a thickness which allows the light transmitting portions 27 to transmit light, so that a part of irradiation light onto the light transmitting portions 27 is not converted into electrical charge and is transmitted through the second photoelectric conversion portion 20.

Each of the inclined surfaces 27b is set to be at an angle at which light reflected by the inclined surfaces 27b is not directed to condenser lenses 31 of the phase difference detection unit 30, which will be described later, when light is transmitted through the light transmitting portions 27. Thus, formation of a non-real image on a line sensor 33, which will be described later, is prevented.

Each of the light transmitting portions 27 forms a reduced-thickness portion which transmits light entering the imaging device 1, i.e., which allows light entering the imaging device 1 to pass therethrough. The term "passing" includes the concept of "transmitting" at least in this specification.

Figure 5:
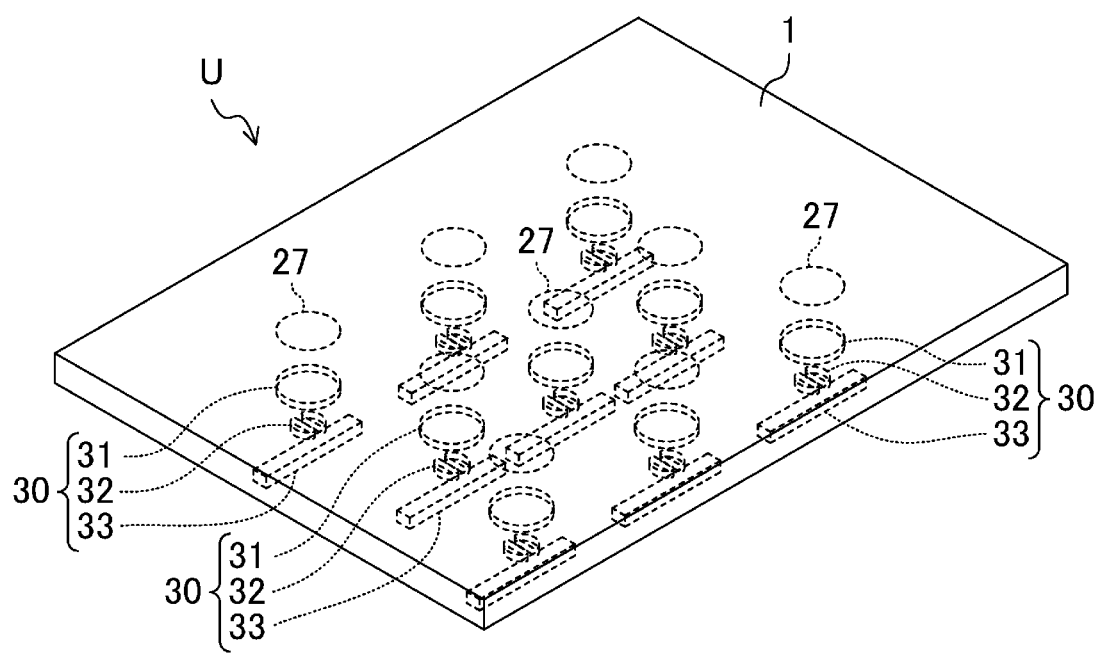
FIG. 5 is a schematic perspective view of an imaging unit.

Next, the phase difference detection unit 30 will be described with reference to FIGS. 1 and 5. FIG. 5 is a schematic perspective view of an imaging unit.

The phase difference detection unit 30 receives light transmitted through the imaging device 1 and performs phase difference detection. Specifically, the phase difference detection unit 30 converts the received transmitted light into an electrical signal used for distance measurement. The phase difference detection unit 30 forms a phase difference detection portion.

The phase difference detection unit 30 is provided in the back of the imaging device 1 (i.e., at an opposite side to a side facing an object) specifically, in the back of each of the light transmitting portions 27. In this embodiment, as shown in FIG. 5, nine light transmitting portions 27, 27, . . . are provided in the imaging device 1. Accordingly, nine phase difference detection units 30, 30, . . . are provided.

The phase difference detection unit 30 includes a condenser lens 31, a separator lens 32, and a line sensor 33. The condenser lens 31, the separator lens 32, and the line sensor 33 are arranged in this order from the imaging device 1 side along the thickness direction of the imaging device 1.

The condenser lens 31, which are provided for collecting incident light, collects light transmitted through the light transmitting portions 27 and spreading out, and leads the light to the separator lens 32.

Since an incident angle of light entering each of the separator lenses 32 is reduced by providing the condenser lenses 31, an aberration of the separator lenses 32 can be reduced, and a distance between object images on the line sensor 33 which will be described later can be reduced. As a result, the sizes of the separator lenses 32 and the line sensors 33 can be reduced. Additionally, when a focus position of an object image from the imaging optical system greatly diverges from the imaging unit U (specifically, greatly diverges from the imaging device 1 of the imaging unit U), the contrast of the image is remarkably reduced. According to this embodiment, however, due to the size-reduction effect of the condenser lenses 31 and the separator lenses 32, reduction in contrast can be prevented, so that a focus detection range can be increased. If highly accurate phase difference detection around a focus position is performed, or if the separator lenses 32, and the line sensors 33, etc. are of sufficient dimensions, the condenser lens unit 31 does not have to be provided.

Each of the separator lenses 32 forms two identical object images on the line sensor 33 from two light bundles which have entered the separator lens 32.

Each of the line sensors 33 receives a light image formed on an imaging plane and converts the image into an electrical signal. That is, a distance between the two object images can be detected from an output of the line sensor 33, and a shift amount (defocus amount: Df amount) of a focus of an object image to be formed on the imaging device 1 and the direction (defocus direction) in which the focus is shifted can be obtained, based on the distance. (The Df amount, and the defocus direction, etc. will be hereinafter also referred to as "defocus information.")

The imaging unit U configured in the above-described manner is connected to a control section (which corresponds to, for example, a body control section 5 of a second embodiment, although not shown in the drawings in this embodiment). Note that, in this embodiment, the control section is not included in the imaging unit U, but the imaging unit U may be configured to include a control section. The control section obtains an object image as an electrical signal based on an output signal from the imaging device 1 and defocus information based on an output signal from the phase difference detection unit 30.

The operation of the imaging unit U will be described below. FIG. 6 shows graphs showing spectral characteristics of filters and photoelectric conversion portions in pixels corresponding to green color filters. FIG. 7 shows graphs showing spectral characteristics of filters and substrates in pixels corresponding to blue color filters. FIG. 8 shows graphs showing spectral characteristics of filters and substrates in pixels corresponding to white filters. In each of FIGS. 6-8, (A) shows spectral characteristics of the first filter, (B) shows spectral characteristics of the first photoelectric conversion portion 10, and (C) shows spectral characteristics of the second filter.

When light enters the imaging unit U from an object, the light enters the imaging device 1. The light is collected by the microlenses 17 of the first imaging portion 1A, and then, is transmitted through the first filters 16, so that only light in a specific wavelength range reaches the light receiving portions 12 of the first photoelectric conversion portion 10. Specifically, in the green color filters 16g, light in a wavelength range indicated by a shaded area of FIG. 6(A) is transmitted through the green color filters 16g, and reaches the light receiving portions 12. In the blue color filters 16b, light in a wavelength range indicated by a shaded area of FIG. 7(A) is transmitted through the blue color filter 16b and reaches the light receiving portions 12. Furthermore, in the write filters 16w, as indicated by a shaded area of FIG. 8(A), at least light in a visible range and light in an infrared range are transmitted without being attenuated, and reach the light receiving portions 12. Each of the light receiving portions 12 absorbs light which has reached the light receiving portion 12 and generates electrical charge. The generated electrical charge is transmitted to an amplifier through the first vertical resisters 13 and the first transfer paths 14, and is output as an electrical signal.

As described above, the green and blue color filters 16g and 16b mainly transmit light in a blue wavelength range and light in a green wavelength range, respectively, and hardly transmit infrared light. Therefore, the light receiving portions 12, 12, . . . corresponding to the green and blue color filters 16g and 16b are not greatly influenced by infrared light, and in the light receiving portions 12, 12, . . . , the amounts of green light and blue light can be obtained.

On the other hand, the white filters 16w transmit light in almost all wavelength ranges. Therefore, not only light in a visible wavelength range but also light in an infrared range enter the light receiving portions 12, 12, . . . corresponding to the white filters 16w. As a result, in the light receiving portions 12, 12, . . . corresponding to the white filters 16w, the amount of light including infrared light can be obtained.

Not all of light which has entered the first photoelectric conversion portion 10 is photoelectric-converted in the light receiving portions 12, but a part of the light is transmitted through the substrate 11. Specifically, the substrate 11 has spectral characteristics, which are indicated a dashed line in FIGS. 6-8. That is, light transmitted through the color filters 16g, 16b, and 16w are attenuated as shown in FIGS. 6(B), 7(B), and 8(B), when being transmitted through the substrate 11.

Light transmitted through the first photoelectric conversion portion 10 enters the second imaging portion 1B. The light is transmitted through the second filters 26 of the second imaging portion 1B, and thus, only light in a specific wavelength range reaches the light receiving portions 22 of the second photoelectric conversion portion 20. Specifically, the second filters 26 have spectral characteristics, which are indicated by an area where an area surrounded by a solid line and an area surrounded by a chain double-dashed line overlap in FIGS. 6-8. That is, as shown in FIGS. 6(C), 7(C), and 8 (C), the second filters 26 transmit light in the partial range of the red visible wavelength range, which is shorter than the infrared wavelength range. As a result, a part of light transmitted through the first filters 16 and the first photoelectric conversion portion 10, i.e., light in the partial range of the red visible wavelength range, which is shorter than the infrared wavelength range reaches the light receiving portions 22 of the second photoelectric conversion portion 20. The light receiving portions 22 absorb light which has reached the light receiving portions 22, and generate electrical charge. That is, in the light receiving portions 22, the amount of red light which does not include infrared light can be obtained.

In the above-described manner, each of the light receiving portions 12, 12, . . . of the first photoelectric conversion portion 10 and the light receiving portions 22, 22, . . . of the second photoelectric conversion portion 20 converts light into an electrical signal throughout the entire imaging plane, and thereby, the imaging device 1 converts an object image formed on the imaging plane into an electrical signal for generating an image signal. That is, the imaging device 1 obtains color information of green light and blue light each of which does not include infrared light at the light receiving portions 12, 12, . . . of the first photoelectric conversion portion 10, and obtains information of red light which does not include infrared light at the light receiving portions 22, 22, . . . of the second photoelectric conversion portion 20. Thus, based on the red color information, green color information, and blue color information obtained in the above-described manner, imaging with high color reproducibility can be preformed. The imaging device 1 can obtain color information of white light including infrared light at ones of the light receiving portions 12, 12, . . . of the first photoelectric conversion portion 10 corresponding to the white filters 16w. Thus, based on the information of infrared light obtained in the above-described manner, imaging with high sensitivity can be performed, and contrast-type autofocus with high sensitivity can be performed. As opposed to a known digital camera, an infrared cut filter does not have to be provided in front of the imaging device, and thus, the entire optical length of the camera body can be reduced, so that the size and cost of cameras can be reduced.

In this case, in the light receiving portions 12, 12, . . . and 22, 22, . . . , even when the same light amount is received, the amount of accumulated charges are different among different lights having different wavelengths. Also, the light receiving portions 22, 22, . . . of the second photoelectric conversion portion 20 receive light which has been transmitted through the first photoelectric conversion portion 10 and attenuated, and, in view of this point, the amount of accumulated charge differs between the light receiving portions 12, 12, . . . of the first photoelectric conversion portion 10 and the light receiving portions 22, 22, . . . of the second photoelectric conversion portion 20. Thus, outputs from the light receiving portions 12, 12, . . . and 22, 22, . . . of the imaging device 1 are corrected according to the types of the color filters respectively provided to the light receiving portions 12 and 22. For example, a correction amount for each pixel is determined so that respective outputs of the R pixel 22, the G pixel 12 and the B pixel 12 become at the same level, when each of a R pixel 22 to which the second filter 26 transmitting red light is provided, a G pixel 12 to which the green color filter 16g is provided, and a B pixel 12 to which the blue color filter 16b is provided receives the same light amount of light corresponding to the color of each color filter. That is, outputs from the light receiving portions 12 and 22 of the imaging device 1 are corrected, considering that the area of the R pixel 22 is four times as large as the area of G pixel 12, and also, four times as large as the area of the B pixel 12, and thus the amount of received light in the R pixel is four times as large as that of G pixel 12, and also, four times as large as that of the B pixel 12.

In this embodiment, the light transmitting portions 27, 27, . . . are provided in the substrate 21 of the second photoelectric conversion portion 20, and thus, the photoelectric conversion efficiency is reduced in the light transmitting portions 27, 27, . . . , compared to the other portions. That is, even when the pixels 22, 22, . . . receive the same light amount, the amount of accumulated charges is smaller in ones of the pixels 22, 22, . . . provided in positions corresponding to the light transmitting portions 27, 27, . . . than in the other ones of the pixels 22, 22, . . . provided in positions corresponding to the other portions. Accordingly, when the same image processing as image processing for output data from the pixels 22, 22, . . . provided in positions corresponding to the other portions is performed to output data from the pixels 22, 22, . . . provided in positions corresponding to the light transmitting portions 27, 27, . . . , parts of an image corresponding to the light transmitting portions 27, 27, . . . might not be able to be properly captured (for example, shooting image is dark). Therefore, an output of each of the pixels 22, 22, . . . in the light transmitting portions 27, 27, . . . is corrected to eliminate or reduce influences of the light transmitting portions 27, 27, . . . (for example, by amplifying an output of each of the pixels 22, 22, . . . in the light transmitting portions 27, 27, . . . or like method). Specifically, outputs of the light receiving portions 2, 22, . . . of the second photoelectric conversion portion 20 are corrected not only based on difference in color but also based on whether or not each of the light receiving portions 22, 22, . . . is located at a position corresponding to the light transmitting portion 27. The correction amount of an output of each of the pixels 22 based on whether or not the light receiving portion 22 is located at a position corresponding to the light transmitting portion 27 is determined so that the white balance and/or intensity is equal for each of an image displayed by an output from the light transmitting portion 27 and an image displayed by an output from some other portion than the light transmitting portion 27.

After correcting an output signal of each of the light receiving portions 12, 12, . . . and 22, 22, . . . in the above-described manner, the control section generates, based on the output signal, an image signal including location information, color information, and intensity information in each of the light receiving portions, i.e., pixels 12, 12, . . . and 22, 22, . . . . Thus, an image signal of an object image formed on the imaging plane of the imaging device 1 can be obtained.

Color information in each light receiving portion 12 will be described in more detail below. In each of the light receiving portions 12, a filter corresponding thereto is provided, and the light receiving portion 12 receives light in a wavelength range corresponding to the filter. Thus, color information other than color information of light in the wavelength range corresponding to the filter is interpolated based on outputs of neighboring light receiving portions 12. Specifically, in the G pixel 12 corresponding to the green color filter 16g, green color information is obtained based on an output signal from the G pixel 12, red color information is obtained based on an output signal of the R pixel 22 of the second photoelectric conversion portion 20 located on the back of the G pixel 12, and blue color information is interpolated based on output signals of the B pixels 12, 12 corresponding to two blue color filters 16b arranged adjacent to the G pixel 12 with the G pixel 12 interposed therebetween. In the B pixel 12 corresponding to the blue color filter 16b, blue color information is obtained based on an output signal from the B pixel 12, red color information is obtained based on an output signal of the R pixel 22 of the second photoelectric conversion portion 20 located on the back of the B pixel 12, and green color information is interpolated based on output signals of the G pixels 12, 12, . . . corresponding to four green color filters 16g adjacent to four sides of the B pixel 12. Furthermore, in the W pixel 12 corresponding to the white color filter 16w, red color information is obtained based on an output signal of the R pixel 22 of the second photoelectric conversion portion 20 located on the back of the W pixel 12, green color information is interpolated based on output signals of the G pixels 12, 12 corresponding to four green color filters 16g adjacent to four sides of the W pixel 12, and blue color information is interpolated based on output signals of the B pixels 12, 12 corresponding to two blue color filters 16b arranged adjacent to the W pixel 12 with the W pixel 12 interposed therebetween. In the above-described manner, in each of the pixels 12, red color information, blue color information, and green color information are obtained. At this time, color information of white light and infrared light is obtained from the W pixel 12 corresponding to the white filter 16w of the first photoelectric conversion portion 10.

In the light transmitting portions 27, 27, . . . of the second photoelectric conversion portion 20, a part of irradiation light is transmitted through the second photoelectric conversion portion 20. The light transmitted through the second photoelectric conversion portion 20 enters the condenser lenses 31. The light transmitted through each of the condenser lenses 31 and collected enters each of the separator lenses 32. Light is subjected to pupil division at the separator lens 32, and thus, identical object images are formed on two positions on the line sensor 33. Similar to the first photoelectric conversion portion 10 and the second photoelectric conversion portion 20, the line sensor 33 performs photoelectric conversion to an amount of received light in each of the light receiving portions to generate an electrical signal and then outputs the electrical signal.

An output signal from the line sensor 33 is input to a control section. The control section may be the control section of the imaging device 1 or may be a separate one from the control section of the imaging device 1. The control section can obtain a distance between two object images formed on the line sensor 33, based on the output signal, and then, can detect a focus state of an object image formed on the imaging device 1 from the obtained distance. For example, when an object image is transmitted through an imaging lens and is correctly formed on the imaging device 1 (in focus), the two object images formed on the line sensor 33 are located at predetermined reference positions with a predetermined reference distance therebetween. In contrast, when an object image is formed before the imaging device 1 in the optical axis direction (at a front pin), the distance between the two object images is smaller than the reference distance when the object image is in focus. When an object image is formed behind the imaging device 1 in the optical axis direction (at a rear pin), the distance between the two object images is larger than the reference distance when the object image is in focus. That is, an output from the line sensor 33 is amplified, and then, an arithmetic circuit performs an operation, so that whether an object image is in focus or not, at which the front pin or the rear pin an object image is formed, and the Df amount can be known. In the above-described manner, the control section detects a distance between two object images formed on the line sensor 33 based on the output signal from the line sensor 33, and obtains defocus information from the distance.

Therefore, according to this embodiment, the first photoelectric conversion portion 10 is configured so that light is transmitted therethrough, the second filters 26 for filtering at least infrared light are provided in the back of the first photoelectric conversion portion 10, and the second photoelectric conversion portion 20 is provided in the back of the second filters 26. Thus, light including infrared light can be photoelectric-converted by the first photoelectric conversion portion 10, and light which does not include infrared light can be photoelectric-converted by the second photoelectric conversion portion 20. That is, even in a low light intensity environment, such as in darkness, etc., the first photoelectric conversion portion 10 can receive light including infrared light, and thus, imaging can be performed. As a result, even in a low light intensity environment, image recognition, contrast-type autofocus in which a focus state is determined based on the contrast can be performed. In addition, in the second photoelectric conversion portion 20, light which does not include infrared light is received and imaging is performed, and thus, imaging with high color reproducibility can be achieved.

As described above, imaging with high color reproducibility and imaging with high sensitivity in low light intensity environment can be both allowed. Since the imaging device is not configured so that switching of the position of the IR cut filter between an installation position and an evacuation position is performed by some other mechanism, or is not configured so that switching of the position of the IR cut filter between an installation position and an evacuation position is performed in conjunction with some other member, the first photoelectric conversion portion 10 can receive infrared light all the time, and infrared light can be flexibly used as necessary.

Also, in the above-described embodiment, the light receiving portions 22, 22, . . . of the second photoelectric conversion portion 20 receive light transmitted through the first photoelectric conversion portion 10, and thus, the amount of light entering the second photoelectric conversion portion 20 is smaller than the amount of light entering the first photoelectric conversion portion 10. However, the light receiving portions 22 can be formed to each have a larger area than the area of each of the light receiving portions 12, thereby allowing a sufficient amount of light to enter each of the light receiving portions 22 and thus performing photoelectric conversion.

Furthermore, the light receiving portions 22, 22, . . . of the second photoelectric conversion portion 20 receive red light. Thus, even when the second photoelectric conversion portion 20 is configured to receive light transmitted through the first photoelectric conversion portion 10 and perform photoelectric conversion, the second photoelectric conversion portion 20 can receive a sufficient amount of light and perform photoelectric conversion. That is, as indicated by the dashed lined in FIGS. 6-8, red light is attenuated less, as compared to green light and blue light, when being transmitted through the substrate 11. Therefore, the light receiving portions 22, 22, . . . of second photoelectric conversion portion 20 are configured to receive red light, so that a lager amount of light can be received.

Furthermore, ones of light receiving portions 12, 12, . . . of the first photoelectric conversion portion 10 other than the light receiving portions 12, 12, . . . corresponding to the white filters 16w receive green light and blue light. Thus, light which hardly includes infrared light can be received without filtering infrared light beforehand. That is, assuming that red color filters are provided to the light receiving portions 12, 12, . . . of the first photoelectric conversion portion 10, the red color filters have spectral characteristics, as indicated by the chain double-dashed lines in FIGS. 6-8, showing that light transmitted through the light receiving portions 12, 12, . . . includes infrared light. That is, the light receiving portions 12, 12, . . . receive red light including infrared light. As a result, imaging cannot be performed with high color reproducibility, i.e., with spectral sensitivity close to the spectral sensitivity of the human eye. In contrast, the green and blue color filters 16g and 16b have spectral characteristics, as indicated by the dashed lines and chain double-dashed lines in FIGS. 6-8, showing that light transmitted through the green and blue color filters 16g and 16b hardly include infrared light. That is, the green and blue color filters 16g and 16b respectively transmit light in a green wavelength range and light in a blue wavelength range, thereby substantially filtering infrared light. As a result, color information used for generating image data can be obtained from light which has not been transmitted through the first photoelectric conversion portion 10, i.e., light which has not been attenuated, so that the sensitivity can be improved.

In this embodiment, the second photoelectric conversion portion 20 is configured so that light is transmitted therethrough. Thus, with the phase difference detection unit 30 provided in the back of the second photoelectric conversion portion 20, phase difference detection can be performed. As a result, phase difference detection can be performed, while imaging is performed.

Note that, in this embodiment, the light transmitting portions 27 are each formed in the substrate 21 so as to have a smaller thickness than parts of the substrate 21 located around each of the light transmitting portions 27. However, the configuration of the light transmitting portion is not limited thereto. For example, the thickness of the entire substrate 21 may be determined so that a part of irradiation light onto the substrate 21 is transmitted in a sufficient amount through the substrate 21 to reach the phase difference detection unit 30 provided in the back of the substrate 21. In such a case, the entire substrate 21 serves as a light transmitting portion.

In this embodiment, nine light transmitting portions 27, 27, . . . are formed, and accordingly, nine phase difference detection units 30, 30, . . . are provided. However, the configuration including those components is not limited thereto. Each of the number of the light transmitting portions 27, 27, . . . and the number of the phase difference detection units 30, 30, . . . is not limited to nine, but may be set to be any number.

—First Variation—

Figure 9:
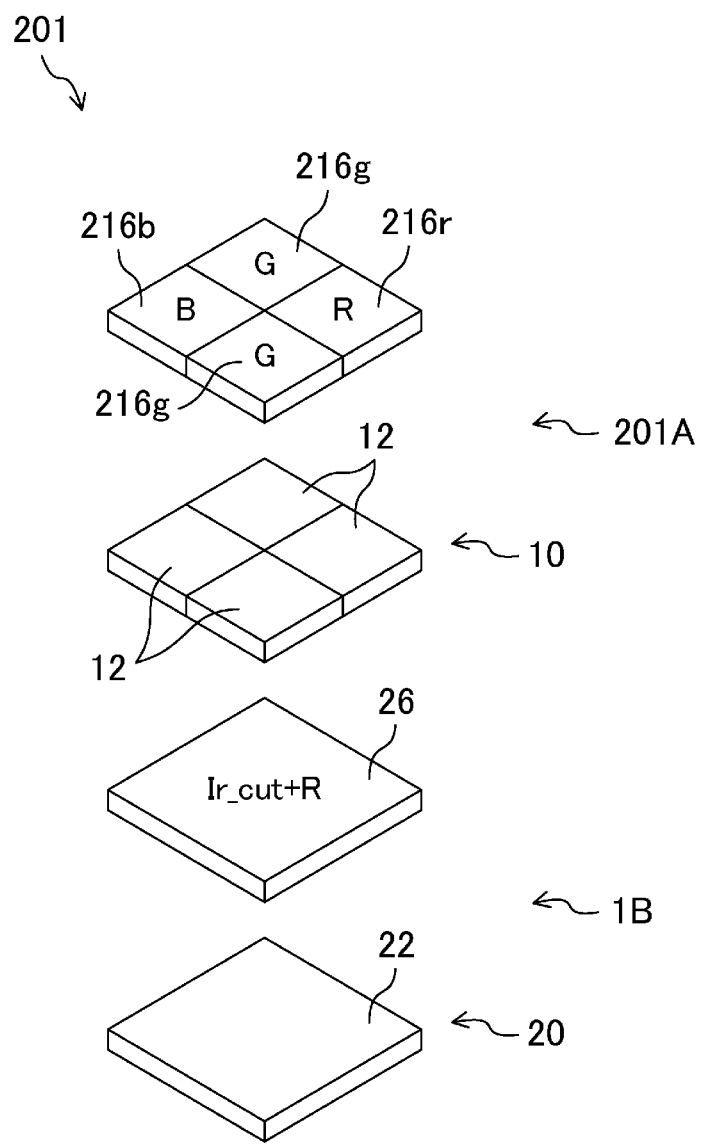
FIG. 9 is a schematic exploded perspective view of an imaging device according to a first variation.

Next, a first variation of the first embodiment will be described with reference to FIG. 9. FIG. 9 is a schematic exploded perspective view of an imaging device according to the first variation.

An imaging device 201 according to the first variation is different from the imaging device 1 of the first embodiment in that a filter of a first imaging portion 201A has a different configuration from that of the first imaging portion 1A. Each member also described in the first embodiment is identified by the same reference character, the description thereof is omitted, and only parts having a different configuration will be mainly described.

The imaging device 201 includes the first imaging portion 201A and a second imaging portion 201B which are stacked.

The configuration of the first imaging portion 201A is similar to that of the first imaging portion 1A of the first embodiment, except for the configuration of a first filter 216.

The first filters 216 are color filters each of which transmits only light of a specific color, and are made of primary color filters in a Bayer array pattern, i.e., a plurality of color filters 216r, 216g, 216b, . . . arranged in a matrix pattern. That is, the imaging device 1 includes repeated units, each including four adjacent color filters 216g, 216g, 216b, . . . , (or four pixel regions) arranged in a 2-by-2 array, where each repeated unit includes two green color filters 216g arranged at one of two pairs of opposing corners, with a red color filter 216r, a blue filter 216b, . . . arranged at the other pair of opposing corners. As a whole, the green color filters 216g, 216g, . . . , are arranged at every other positions in the vertical direction and in the horizontal direction.

Figure 10:
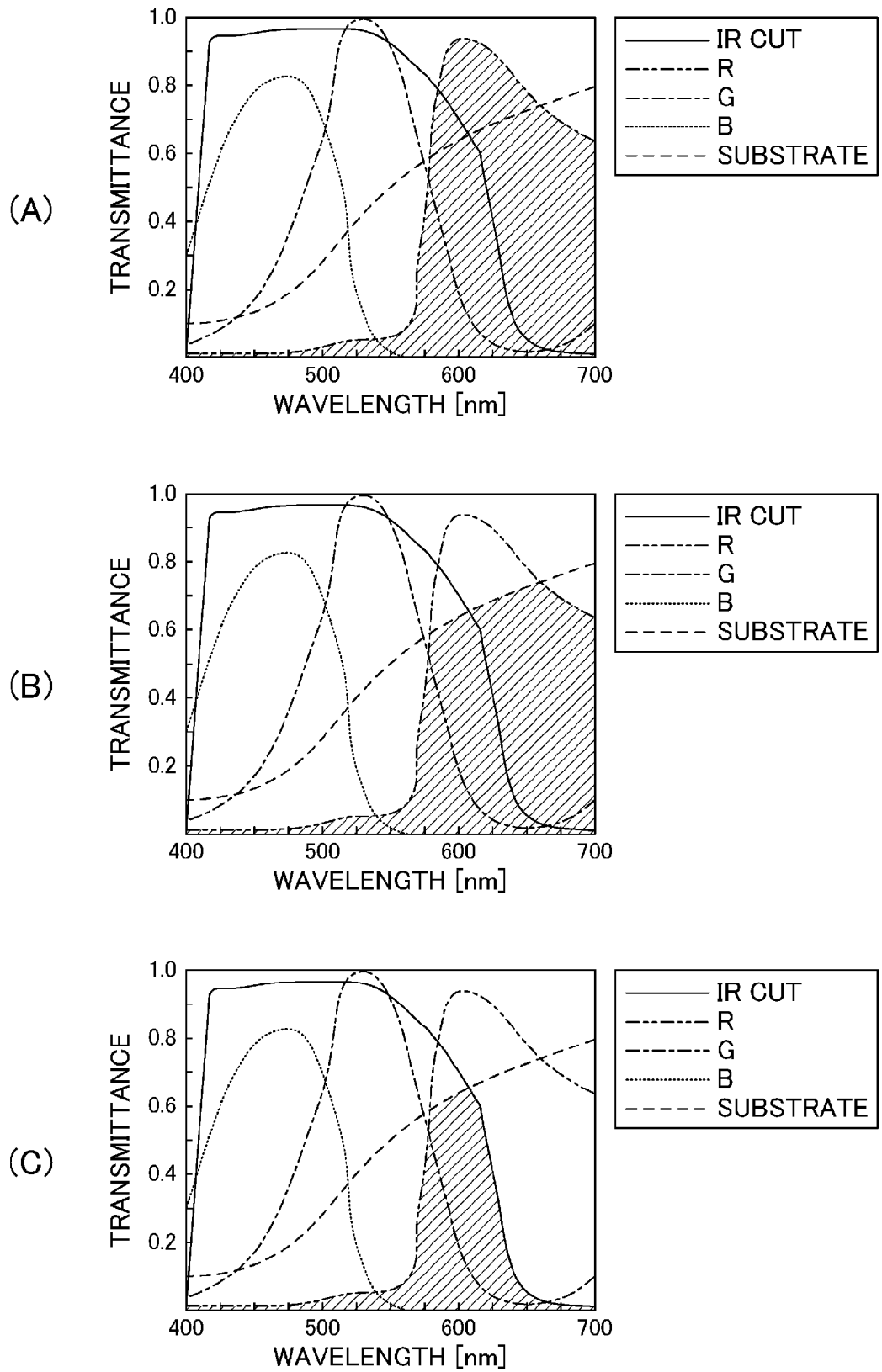
FIG. 10 includes graphs showing spectral characteristics of filters and a substrate in pixels corresponding to red color filters.

When light enters the imaging device 201 configured in the above-described manner, the light is collected by the microlenses (not shown in FIG. 9) of the first imaging portion 201A, and then, is transmitted through the first filters 216, so that only light in a specific wavelength range reaches the light receiving portions 12 of the first photoelectric conversion portion 10. Specifically, in the green and blue color filters 216g and 216b, light is transmitted through the color filters 216g and 216b in the manner described in the above-described embodiment. In the red color filters 216r, light in a wavelength range indicated by a shaded area of FIG. 10(A) is transmitted through the red color filter 216r and reaches the light receiving portions 12. Each of the light receiving portions 12 absorbs light which has reached the light receiving portion 12 and generates electrical charge. The generated electrical charge is transmitted to an amplifier through the first vertical resisters and the first transfer paths, and is output as an electrical signal. Since the red color filters 216r transmits light in a red wavelength range and light in infrared range, not only light in a red wavelength range but also light in an infrared range enter the light receiving portions 12, 12, . . . corresponding to the red color filters 216r. As a result, in the light receiving portions 12, 12, . . . corresponding to the red color filters 216r, the light amount of light including infrared light can be obtained.

A part of light which has entered the first photoelectric conversion portion 10 is transmitted through the substrate 11. As shown in FIGS. 6(B), 7(B), and 10(B), light transmitted through the substrate 11 is attenuated by the substrate 11.

Light transmitted through the first photoelectric conversion portion 10 in the above-described manner enters the second imaging portion 1B. The light is transmitted through the second filters 26 of the second imaging portion 1B, so that only light in a specific wavelength range reaches the light receiving portions 22 of the second photoelectric conversion portion 20. Specifically, the second filters 26 has spectral characteristics indicated by an area where an area surrounded by a solid line and an area surrounded by a chain double-dashed line overlap in FIGS. 6, 7, and 10. That is, as indicated by shaded areas of FIGS. 6(C), 7(C), and 10(C), the second filter 26 transmits light in the partial range of the red visible wavelength range, which is shorter than the infrared wavelength range. As a result, in the light receiving portions 22 of the second photoelectric conversion portion 20, only a part of light transmitted through the first filters 16 and first photoelectric conversion portion 10, i.e., light in a partial range of the red visible wavelength range, which is shorter than the infrared wavelength range reaches the light receiving portions 22 of the second photoelectric conversion portion 20. The light receiving portions 22 absorb light which has reached the light receiving portions 22, and generate electrical charge. That is, in the light receiving portions 22, the amount of red light which does not include infrared light can be obtained.

Thus, the imaging device 201 obtains color information of green light and blue light each of which does not include infrared light at the light receiving portions 12, 12, . . . of the first photoelectric conversion portion 10, and obtains color information of red light which does not include infrared light at the light receiving portions 22, 22, . . . of the second photoelectric conversion portion 20. Based on the red color information, green color information, and blue color information obtained in the above-described manner, imaging with high color reproducibility can be preformed. The imaging device 201 can obtain color information of red light including infrared light at ones of the light receiving portions 12, 12, . . . corresponding to the red color filters 216r of the first photoelectric conversion portion 10. Thus, based on the information of infrared light obtained in the above-described manner, imaging with high sensitivity and contrast-type autofocus with high sensitivity can be performed.

—Second Variation—

Figure 11:
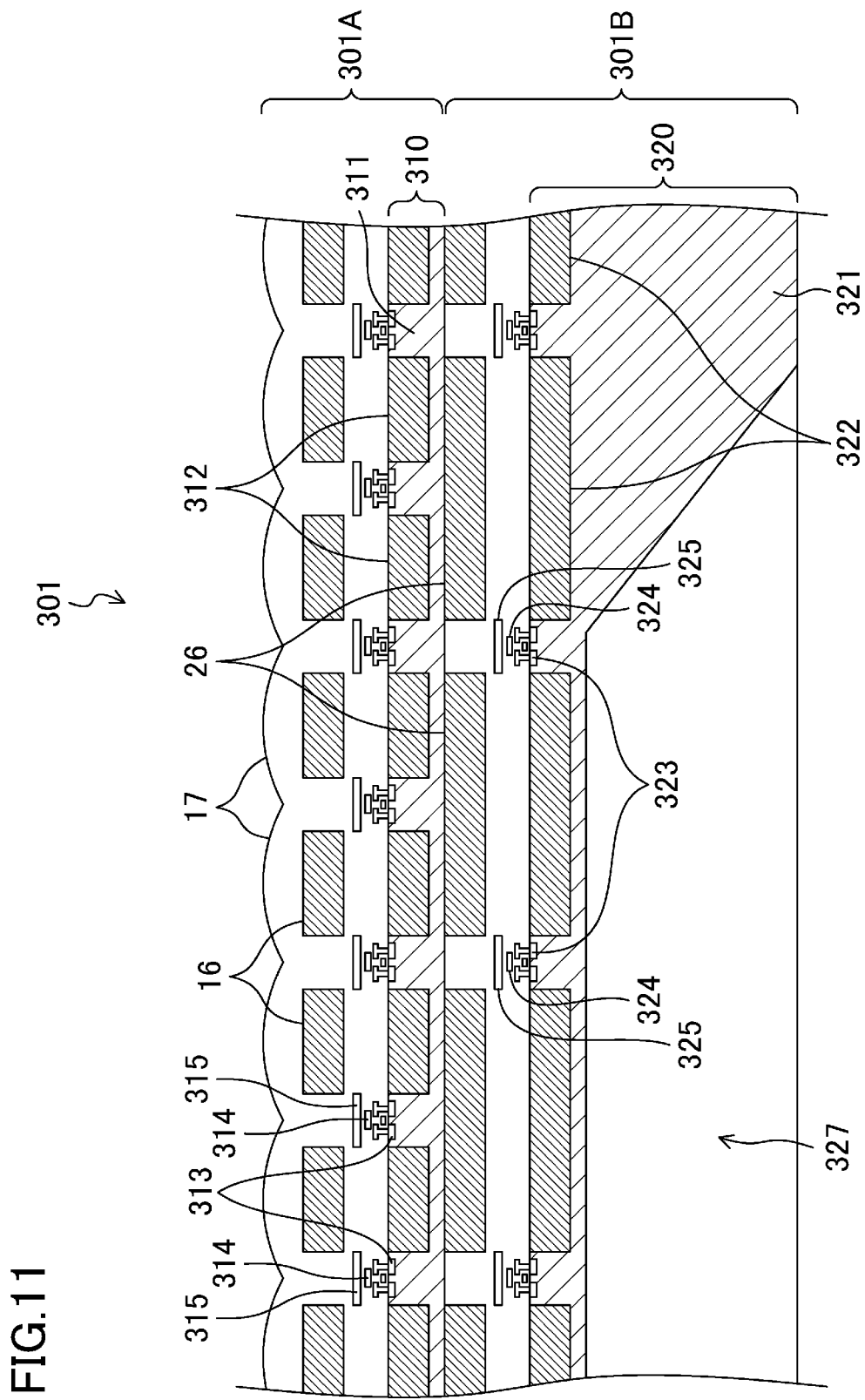
FIG. 11 is a schematic cross-sectional view an imaging device according to a second variation.

Subsequently, an imaging device 301 according to a second variation will be described with reference to FIG. 11. The imaging device 301 of the second variation is a CMOS image sensor, not a CCD image sensor, and in this point, the second variation is different from the first embodiment.

The imaging device 301 is a CMOS image sensor, and a first imaging portion 301A includes a first photoelectric conversion portion 310 made of a semiconductor material, transistors 313, signal lines 314, masks 315, first filters 16, and first microlenses 17. The configurations of the first filter 16 and the first microlens 17 are similar to those of the first embodiment. A second imaging portion 301B includes a second photoelectric conversion portion 320 made of a semiconductor material, transistors 323, signal lines 324, masks 325, and second filters 26. The configuration of the second filter 26 is similar to that of the first embodiment.

The first photoelectric conversion portion 310 includes a substrate 311, and light receiving portions 312, 312, . . . made of photodiodes. Each of the transistors 313 is provided for an associated one of the light receiving portions 312. Electrical charge stored in the light receiving portions 312 is amplified at the transistors 313, and is output to outside through the signal lines 314. The masks 315 are provided to prevent light from entering the transistors 313 and signal lines 314.

The first photoelectric conversion portion 310 is formed to have a thickness with which incident light is transmitted through the first photoelectric conversion portion 310. That is, the first photoelectric conversion portion 310 is configured so that light which has entered the light receiving portions 312 is transmitted through the light receiving portions 312, and further through the substrate 311.

Similarly, the second photoelectric conversion portion 320 includes a substrate 321, and light receiving portions 322, 322, . . . made of photodiodes. Each of the transistors 323 is provided for an associated one of the light receiving portions 322. Electrical charge stored in the light receiving portions 322 is amplified at the transistors 323, and is output to outside through the signal lines 324. The masks 325 are provided to prevent light from entering the transistors 323 and signal lines 324. The area of each of the light receiving portions 322 is four times as large as the area of each of the light receiving portions 312.

Similar to a CCD image sensor, a plurality of light transmitting portions 327 for transmitting irradiation light are formed in the substrate 321. The light transmitting portions 327 are each formed to have a smaller thickness than that of parts of the substrate 321 around each of the light transmitting portions 27.

In the imaging device 301 configured in the above-described manner, color information of green light and blue light each of which does not include infrared light are obtained at the light receiving portions 312, 312, . . . , and color information of red light which does not include infrared light is obtained at the light receiving portions 322, 322, . . . . Based on the red color information, green color information, and blue color information obtained in the above-described manner, imaging with high color reproducibility can be preformed. The imaging device 301 can obtain color information of white light including infrared light at ones of the light receiving portions 312, 312, . . . corresponding to the red color filters 16w of the first photoelectric conversion portion 310. Thus, based on the information of infrared light obtained in the above-described manner, imaging with high sensitivity and contrast-type autofocus with high sensitivity can be performed.

In a CMOS image sensor, the gains of the transistors 313 and 323 can be set separately for light receiving portions 312 and 322. Therefore, the gains of the transistors 313 and 323 can be set based on the types of color filters respectively corresponding to the light receiving portions 312 and 322, and furthermore, in the second photoelectric conversion portion 320, the gain of each of the transistors 323 can be set based on whether or not the transistor 323 is located at a position corresponding to the light transmitting portion 327. Thus, parts of an image corresponding to the light transmitting portions 27 can be properly captured.

Second Embodiment

Next, a camera as an imaging apparatus according to a second embodiment will be described.

Figure 12:
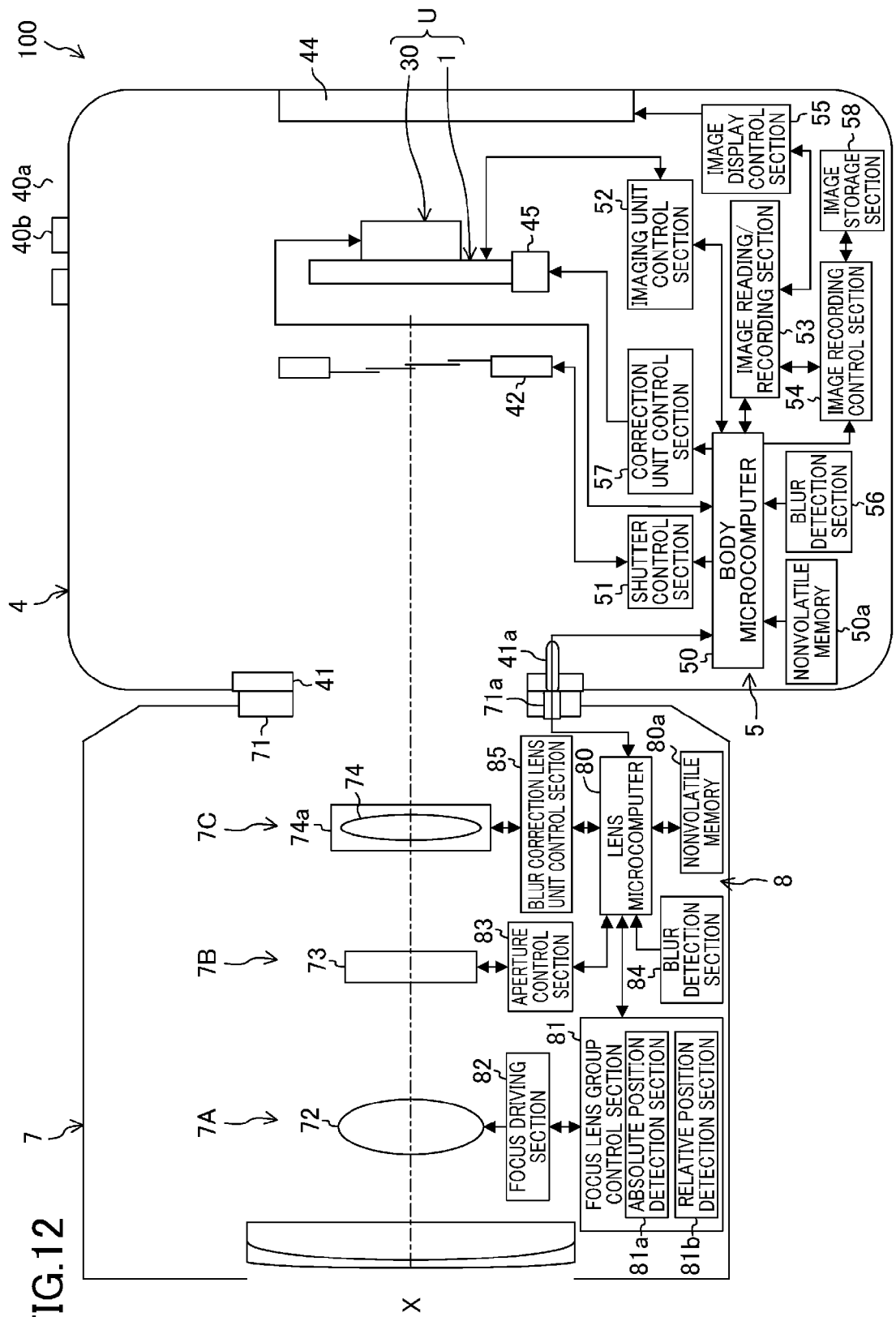
FIG. 12 is a block diagram of a camera according to a second embodiment.

As shown in FIG. 12, a camera 100 according to the second embodiment is a single-lens reflex digital camera with interchangeable lenses and includes, as major components, a camera body 4 having a major function as a camera system, and interchangeable lenses 7 removably attached to the camera body 4. The interchangeable lenses 7 are attached to a body mount 41 provided on a front face of the camera body 4. The body mount 41 is provided with an electric contact piece 41a.

—Configuration of Camera Body—

The camera body 4 includes an imaging unit U for capturing an object image as a shooting image, a shutter unit 42 for adjusting an exposure state of the imaging unit U, an image display section 44, formed of a liquid crystal monitor, for displaying the shooting image, a live view image, and various kinds of information, and a body control section 5.

In the camera body 4, a power switch 40a for turning the camera system ON/OFF, and a release button 40b which is operated by a user when the user performs focusing and releasing operations are provided.

When the camera system is turned ON by the power switch 40a, power is supplied to each part of the camera body 4 and the interchangeable lens 7.

The release button 40b operates as a two-stage switch. Specifically, autofocusing, and AE, etc, which will be described later, is performed by pressing the release button 40b halfway down, and releasing is performed by pressing the release button 40b all the way down.

The imaging unit U is configured to be movable by a blur correction unit 45 in a plane perpendicular to an optical axis X.

The body control section 5 includes a body microcomputer 50, a nonvolatile memory 50a, a shutter control section 51 for controlling driving of the shutter unit 42, an imaging unit control section 52 for controlling of the operation of the imaging unit U and performing A/D conversion of an electrical signal from the imaging unit U to output the converted signal to the body microcomputer 50, an image reading/recording section 53 for reading image data from, for example, a card type recording medium or an image storage section 58 which is an internal memory and recording image data in the image storage section 58, an image recording control section 54 for controlling the image reading/recording section 53, an image display control section 55 for controlling display of the image display section 44, a blur detection section 56 for detecting an amount of an image blur generated due to shake of the camera body 4, and a correction unit control section 57 for controlling the blur correction unit 45.

The body microcomputer 50 is a control device for controlling of core functions of the camera body 4, and performs control of various sequences. The body microcomputer 50 includes, for example, a CPU, a ROM and a RAM. Programs stored in the ROM are read by the CPU, and thereby, the body microcomputer 50 is allowed to execute various functions.

The body microcomputer 50 is configured to receive input signals from the power switch 40a and the release button 40b and output control signals to the shutter control section 51, the imaging unit control section 52, the image reading/recording section 53, the image recording control section 54, and the correction unit control section 57, etc., thereby causing the shutter control section 51, the imaging unit control section 52, the image reading/recording section 53, the image recording control section 54, and the correction unit control section 57, etc. to execute respective control operations. The body microcomputer 50 performs inter-microcomputer communication with a lens microcomputer 80, which will be described later.

For example, according to an instruction of the body microcomputer 50, the imaging unit control section 52 performs A/D conversion of an electrical signal from the imaging unit U to output the converted signal to the body microcomputer 50. The body microcomputer 50 performs predetermined image processing to the received electrical signal to generate image data. Then, the body microcomputer 50 transmits the image data to the image reading/recording section 53, and also instructs the image recording control section 54 to store and display the image data, and thereby, the image data is stored in the image storage section 58 and is transmitted to the image display control section 55. The image display control section 55 controls the image display section 44, based on the transmitted image data to display an image.

The body microcomputer 50 corrects outputs from the light receiving portions 22 based on whether or not the light receiving portions 22 are located at positions corresponding to the light transmitting portions 27, i.e., performs to reduce or eliminate influences of the light transmitting portions 27.

In the nonvolatile memory 50a, various information (unit information) for the camera body 4 is stored. The unit information includes, for example, model information (unit specific information) provided to specify the camera body 4, such as name of a manufacturer, production date and model number of the camera body 4, version information for software installed in the body microcomputer 50 and firmware update information, information regarding whether or not the camera body 4 includes sections for correcting an image blur, such as the blur correction unit 45, and the blur detection section 56, etc., information regarding detection performance of the blur detection section 56, such as a model number, and detection ability, etc., error history, etc. Such information as listed above may be stored in a memory section of the body microcomputer 50, instead of the nonvolatile memory 50a.

The blur detection section 56 includes an angular velocity sensor for detecting movement of the camera body 4 due to hand shake, etc. The angular velocity sensor outputs a positive/negative angular velocity signal according to the direction in which the camera body 4 moves, using as a reference an output in a state where the camera body 4 stands still. In this embodiment, two angular velocity sensors are provided to detect two directions, i.e., a yawing direction and a pitching direction. After being subjected to filtering, and amplification, etc., the output angular velocity signal is converted into a digital signal by the A/D conversion section, and then, is given to the body microcomputer 50.

—Configuration of Interchangeable Lens—

The interchangeable lens 7 forms an imaging optical system for forming an object image on the imaging unit U in the camera body 4, and includes, as major components, a focus adjustment portion 7A for performing a focusing operation, an aperture adjustment portion 7B for adjusting an aperture, a lens image blur correction portion 7C for adjusting an optical path to correct an image blur, and a lens control section 8 for controlling an operation of the interchangeable lens 7.

The interchangeable lens 7 is attached to the body mount 41 of the camera body 4 via a lens mount 71. The lens mount 71 is provided with an electric contact piece 71a which is electrically connected to the electric contact piece 41a of the body mount 41 when the interchangeable lens 7 is attached to the camera body 4.

The focus adjustment portion 7A includes a focus lens group 72 for adjusting a focus. The focus lens group 72 is movable in the optical axis X direction in a zone from a closest focus position predetermined as a standard for the interchangeable lens 7 to an infinite focus position. When a focus position is detected using a contrast detection method which will be described later, the focus lens group 72 has to be movable forward and backward from a focus position in the optical axis X direction. Therefore, the focus lens group 72 has a lens shift margin zone which allows the focus lens group 72 to move forward and backward in the optical axis X direction to a further distance beyond the zone ranging from the closest focus position to the infinite focus position. The focus lens group 72 does not have to be formed of a plurality of lenses, but may be formed of a signal lens.

The aperture adjustment portion 7B includes an aperture portion 73 for adjusting an aperture.

The lens image blur correction portion 7C includes a blur correction lens 74, and a blur correction lens driving section 74a for shifting the blur correction lens 74 in a plane perpendicular to the optical axis X.

The lens control section 8 includes a lens microcomputer 80, a nonvolatile memory 80a, a focus lens group control section 81 for controlling an operation of the focus lens group 72, a focus driving section 82 for receiving a control signal of the focus lens group control section 81 to drive the focus lens group 72, an aperture control section 83 for controlling an operation of the aperture portion 73, a blur detection section 84 for detecting a blur of the interchangeable lens 7, and a blur correction lens unit control section 85 for controlling the blur correction lens driving section 74a.

The lens microcomputer 80 is a control device for controlling of core functions of the interchangeable lens 7, and is connected to each component mounted on the interchangeable lens 7. Specifically, the lens microcomputer 80 includes a CPU, a ROM, and a RAM and, when programs stored in the ROM are read by the CPU, various functions can be executed. For example, the lens microcomputer 80 has the function of setting a lens image blur correction system (the blur correction lens driving section 74a, etc.) to be a correction possible state or a correction impossible state, based on a signal from the body microcomputer 50. Due to the connection of the electric contact piece 71a provided to the lens mount 71 with the electric contact piece 41a provided to the body mount 41, the body microcomputer 50 is electrically connected to the lens microcomputer 80, so that information can be transmitted/received between the body microcomputer 50 and the lens microcomputer 80.

In the nonvolatile memory 80a, various information (lens information) for the interchangeable lens 7 is stored. The lens information includes, for example, model information (lens specific information) provided to specify the interchangeable lens 7, such as name of a manufacturer, production date and model number of the interchangeable lens 7, version information for software installed in the lens microcomputer 80 and firmware update information, and information regarding whether or not the interchangeable lens 7 includes sections for correcting an image blur, such as the blur correction lens driving section 74a, and the blur detection section 84, etc. If the interchangeable lens 7 includes sections for correcting an image blur, the lens information further includes information regarding detection performance of the blur detection section 84 such as a model number, and detection ability, etc., information regarding correction performance (lens side correction performance information) of the blur correction lens driving section 74a such as a model number, and a maximum correctable angle, etc., version information for software for performing image blur correction, etc. Furthermore, the lens information includes information (lens side power consumption information) regarding necessary power consumption for driving the blur correction lens driving section 74a, and information (lens side driving method information) regarding a method for driving the blur correction lens driving section 74a. The nonvolatile memory 80a can store information transmitted from the body microcomputer 50. The information listed above may be stored in a memory section of the lens microcomputer 80, instead of the nonvolatile memory 80a.

The focus lens group control section 81 includes an absolute position detection section 81a for detecting an absolute position of the focus lens group 72 in the optical axis direction, and a relative position detection section 81b for detecting a relative position of the focus lens group 72 in the optical axis direction. The absolute position detection section 81a detects an absolute position of the focus lens group 72 in a case of the interchangeable lens 7. For example, the absolute position detection section 81a includes a several-bit contact-type encoder substrate and a brush, and is capable of detecting an absolute position. The relative position detection section 81b cannot detect the absolute position of the focus lens group 72 by itself, but can detect a moving direction of the focus lens group 72, for example, using a two-phase encoder. As for the two-phase encoder, two rotary pulse encoders, two MR devices, two hole devices, or the like, for alternately outputting binary signals with an equal pitch according to the position of the focus lens group 72 in the optical axis direction are provided so that the phases of their respective pitches are different from each other. The lens microcomputer 80 calculates the relative position of the focus lens group 72 in the optical axis direction from an output of the relative position detection section 81b.

The blur detection section 84 includes an angular velocity sensor for detecting movement of the interchangeable lens 7 due to hand shake and the like. The angular velocity sensor outputs a positive/negative angular velocity signal according to the direction in which the interchangeable lens 7 moves, using, as a reference, an output in a state where the interchangeable lens 7 stands still. In this embodiment, two angular velocity sensors are provided to detect two directions, i.e., a yawing direction and a pitching direction. After being subjected to filtering, and amplification, etc., the output angular velocity signal is converted into a digital signal by the A/D conversion section, and then, is given to the lens microcomputer 80.

A blur correction lens unit control section 85 includes a movement amount detection section (not shown). The movement amount detection section is a detection section for detecting an actual movement amount of the blur correction lens 74. The blur correction lens unit control section 85 performs feedback control of the blur correction lens 74 based on an output of the movement amount detection section.

An example in which the blur detection sections 56 and 84 and the blur correction units 45 and 74a are provided both to the camera body 4 and the interchangeable lens 7 has been described. However, such blur detection section and blur correction unit may be provided to either one of the camera body 4 and the interchangeable lens 7. Also, a configuration where such blur detection section and blur correction unit are not provided to either the camera body 4 or the interchangeable lens 7 is possible (in such a configuration, a sequence regarding the above-described blur correction may be eliminated).

—Description of Operation of Camera—

Figure 13:
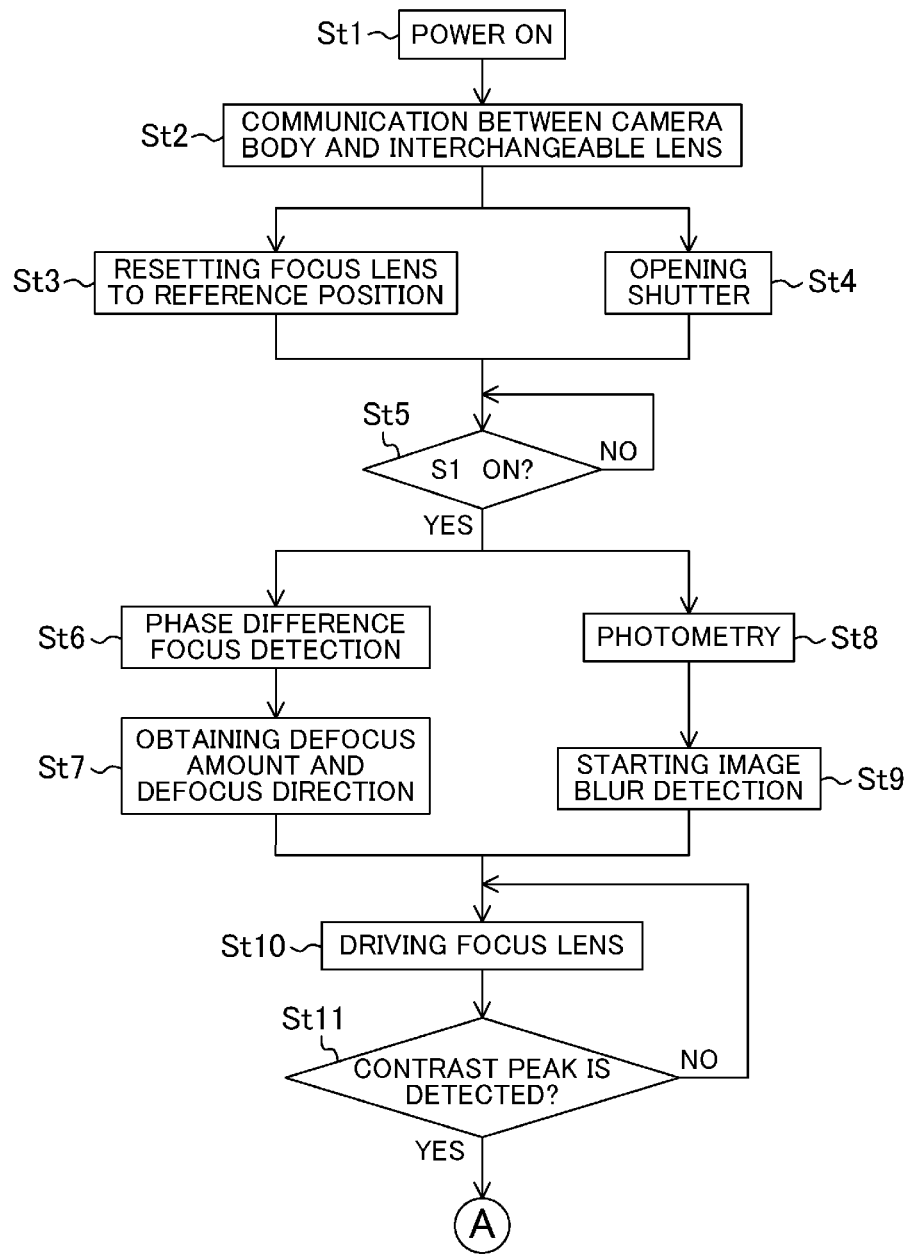
FIG. 13 is a flow chart showing a flow in shooting operation before the release button is pressed all the way down.
Figure 14:
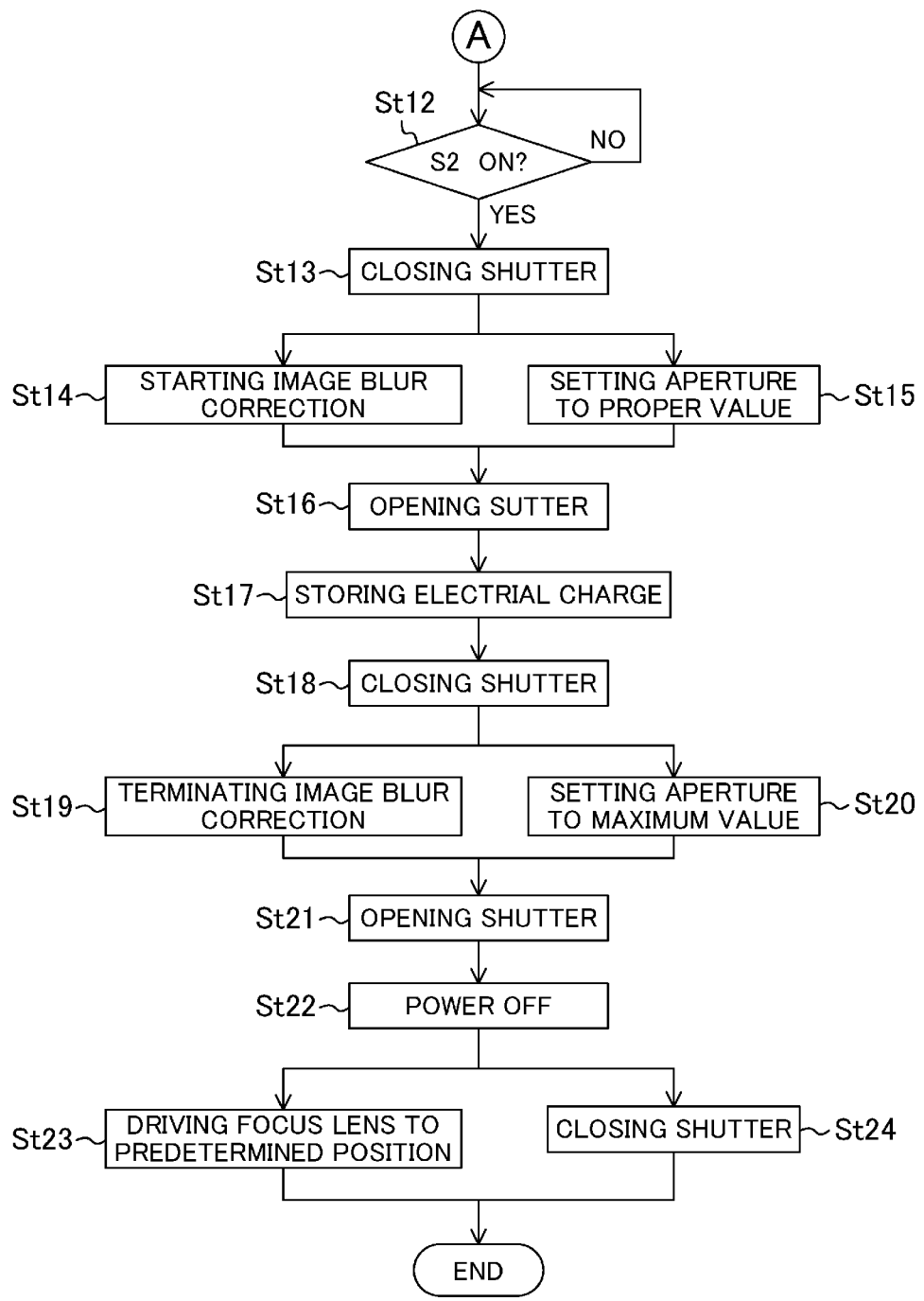
FIG. 14 is a flow chart showing a flow in shooting operation after the release button is pressed all the way down.

The operation of the camera 100 configured in the above-described manner will be described with reference to FIGS. 13 and 14. FIG. 13 is a flow chart showing an operation of the camera 100 up to when a release button is pressed all the way down, and FIG. 14 is a flow chart showing an operation of the camera 100 after the release button is pressed all the way down.

Operations to be described below are controlled primarily by the body microcomputer 50.

First, when the power switch 40a is turned on (Step St1), communication between the camera body 4 and the interchangeable lens 7 is performed (Step St2). Specifically, power is supplied to the body microcomputer 50 and each of other units in the camera body 4 to start up the body microcomputer 50. At the same time, power is supplied to the lens microcomputer 80 and each of other units in the interchangeable lens 7 via the electric contact pieces 41a and 71a to start up the lens microcomputer 80. The body microcomputer 50 and the lens microcomputer 80 are programmed to transmit/receive information to/from each other at start-up time. For example, lens information on the interchangeable lens 7 is transmitted from the memory section of the lens microcomputer 80 to the body microcomputer 50, and then is stored in the memory section of the body microcomputer 50.

Subsequently, the body microcomputer 50 performs positioning the focus lens group 72 at a predetermined reference position which has been determined in advance by the lens microcomputer 80 (Step St3), and in parallel to Step St3, changes the shutter unit 42 to an open state (Step St4). Then, the process proceeds to Step St5, and the body microcomputer 50 remains in a standby state until the release button 40b is pressed halfway down by the user.

Thus, light which has been transmitted through the interchangeable lens 7 and has entered the camera body 4 passes through the shutter unit 42 and enters the imaging unit U. An object image formed at the imaging unit U is displayed on the image display section 44, so that the user can see an erect image of an object via the image display section 44. Specifically, the body microcomputer 50 reads an electrical signal from the imaging device 1 via the imaging unit control section 52 at constant intervals, and performs predetermined image processing on the read electrical signal. Then, the body microcomputer 50 generates an image signal, and controls the image display control section 55 to cause the image display section 44 to display a live view image.

A part of the light which has entered the imaging unit U is transmitted through the imaging device 1, and enters the phase difference detection unit 30.

In this case, when the release button 40b is pressed halfway down (i.e., an S1 switch, which is not shown in the drawings, is turned on) by the user (Step St5), the body microcomputer 50 amplifies an output from the line sensor 33 of the phase difference detection unit 30, and then performs operation by the arithmetic circuit, thereby determining whether or not an object image is in focus (Step St6). Furthermore, the body microcomputer 50 obtains whether the object is in front focus or back focus and the defocus amount to obtain defocus information (Step St7). Thereafter, the process proceeds to Step St10.

In this case, nine phase difference detection units 30 according to this embodiment are provided. That is, nine distance measurement points at which phase difference detection is performed are provided. In phase difference detection in phase, the focus lens group 72 is driven based on an output of the line sensor 33 of one of the sets corresponding to a distance measurement point arbitrarily selected by the user.

Alternatively, an automatic optimization algorithm may be installed in the body microcomputer 50 beforehand in order to select one of the distance measurement points at which the camera is positioned closest to an object and drive the focus lens group 72. Thus, the rate of the occurrence of focusing on the background of the object instead of the object can be reduced.

In parallel to Steps St6 and St7, photometry is performed (Step St8), and image blur detection is also started (Step St9).

Specifically, in Step St8, the amount of light entering the imaging device 1 is measured by the imaging device 1. That is, in this embodiment, the above-described phase difference detection is performed using light which has entered the imaging device 1 and has been transmitted through the imaging device 1, and thus, photometry can be performed using the imaging device 1 in parallel to the above-described phase difference detection.

More specifically, the body microcomputer 50 loads an electrical signal from the imaging device 1 via the imaging unit control section 52, and measures the brightness of an object light, based on the electrical signal, thereby performing photometry. According to a predetermined algorithm, the body microcomputer 50 determines, from a result of photometry, shutter speed and an aperture value which correspond to a shooting mode at a time of the exposure.

When photometry is terminated in Step St8, image blur detection is started in Step St9. Step St8 and Step St9 may be performed in parallel.

Thereafter, the process proceeds to Step St10. Note that, after Step St9, the process may also proceed to Step St12, instead of Step St10.

As decried above, in this embodiment, using light which has entered the imaging device 1 and has been transmitted through the imaging device 1, the above-described focus detection based on a phase difference is performed. Thus, in parallel to the above-describe focus detection, photometry can be performed using the imaging device 1.

In Step St10, the body microcomputer 50 drives the focus lens group 72, based on the defocus information obtained in Step St7.

The body microcomputer 50 determines whether or not a contrast peak is detected (Step St11). During a period in which the contrast peak is not detected (i.e., NO), driving of the focus lens group 72 (Step St10) is repeated. When a contrast peak is detected (i.e., YES), driving of the focus lens group 72 is halted, and the focus lens group 72 is moved to a position where the contrast value has reached the peak. Then, the process proceeds to Step St11.

Specifically, the focus lens group 72 is driven at high speed to a position shifted forward or backward from the position estimated as a focus position, based on the defocus amount calculated in Step St7. Thereafter, a contrast peak is detected while the focus lens group 72 is driven at low speed toward the position estimated as the focus position.

In detection of a contrast peak, output signals of ones of the pixels 12, 12, . . . of the first photoelectric conversion portion 10 corresponding to the write filters 16w are used. In the pixels 12, 12, . . . corresponding to the white filters 16w, the amount of received light including infrared light is obtained, and thus, a contrast peak can be detected using infrared light. Therefore, even in darkness, or like environment, a contrast peak can be detected. Note that, in addition to output signals of the pixels 12, 12, . . . corresponding to the white filters 16w, output signals of the pixels 12, 12, . . . corresponding to the green and blue color filters 16g and 16b, and output signals of the pixels 22, 22, . . . of the second imaging portion 1B may be used to detect contrast peak. Alternatively, based on results of the photometry of Step St8, detection of a contrast peak may be performed such that, when the amount of light is smaller than a predetermined threshold, a contrast peak is detected using output signals of the pixels 12, 12, . . . corresponding to the white filters 16w, and, when the amount of light is larger than the predetermined threshold, a contrast peak is detected using output signals of the pixels 12, 12, . . . corresponding to the green and blue color filters 16g and 16b and output signals of the pixels 22, 22, . . . of the second imaging portion 1B.

When the release button 40b is pressed halfway down by the user, various information on shooting, as well as a shooting image, is displayed on the image display section 44, and thus, the user can confirm each type of information via the image display section 44.

In Step St12, the body microcomputer 50 remains in a standby state until the release button 40b is pressed all the way down (i.e., an S2 switch, which is not shown in the drawings, is turned on) by the user. When the release button 40b is pressed all the way down by the user, the body microcomputer 50 once puts the shutter unit 42 into a closed state (Step St13). Then, while the shutter unit 42 is kept in a closed state, electrical charge stored in the light receiving portions 12, . . . and 22, . . . of the imaging device 1 is transferred for the exposure, which will be described later.

Thereafter, the body microcomputer 50 starts correction of an image blur, based on communication information between the camera body 4 and the interchangeable lens 7 or any information specified by the user (Step St14). Specifically, the blur correction lens driving section 74a in the interchangeable lens 7 is driven based on information of the blur detection section 56 in the camera body 4. According to the intention of the user, any one of (i) use of the blur detection section 84 and the blur correction lens driving section 74a in the interchangeable lens 7, (ii) use of the blur detection section 56 and the blur correction unit 45 in the camera body 4, and (iii) use of the blur detection section 84 in the interchangeable lens 7 and the blur correction unit 45 in the camera body 4 can be selected.

By starting driving of the image blur correction sections at a time when the release button 40b is pressed halfway down, the movement of an object desired to be in focus is reduced, and AF can be performed with higher accuracy.

The body microcomputer 50 stops down, in parallel to starting of image blur correction, the aperture portion 73 by the lens microcomputer 80 so as to attain an aperture value calculated based on a result of photometry in Step St8 (Step St15).

Thus, when the image blur correction is started and the aperture operation is terminated, the body microcomputer 50 puts the shutter unit 42 into an open state, based on the shutter speed obtained from the result of photometry in Step St8 (Step St16). In the above-described manner, the shutter unit 42 is put into an open state, so that light from the object enters the imaging device 1, and electrical charge is stored in the imaging device 1 only for a predetermined time (Step St17).

The body microcomputer 50 puts the shutter unit 42 into a closed state, based on the shutter speed, to terminate the exposure (Step St18). After the termination of the exposure, in the body microcomputer 50, image data is read out from the imaging unit U via the imaging unit control section 52 and generate image data. Then, after performing predetermined image processing on the image data, the image data is output to the image display control section 55 via the image reading/recording section 53. Thus, a shooting image is displayed on the image display section 44. The body microcomputer 50 stores the image data in the image storage section 58 via the image recording control section 54, as necessary.

Then, the body microcomputer 50 generates image data based on output signals of the pixels 12, 12, . . . of first photoelectric conversion portion 10 corresponding to the green and blue color filters 16g and 16b, and output signals of the pixels 22, 22, . . . of the second photoelectric conversion portion 20. That is, the body microcomputer 50 generates image data with highly color reproducibility based on color information of light which does not including infrared light. Note that the body microcomputer 50 may be configured to generate, when it is determined, as a result of the photometry of Step St8, that the amount of light is small, image data using output signals of the pixels 12, 12, . . . of the first photoelectric conversion portion 10 corresponding to the white filters 16w. Thus, imaging with high sensitivity can be preformed.

Thereafter, the body microcomputer 50 terminates image blur correction (Step St19), and releases the aperture portion 73 (Step St20). Then, the body microcomputer 50 puts the shutter unit 42 into an open state (Step St21).

When a reset operation is terminated, the lens microcomputer 80 notifies the body microcomputer 50 of the termination of the reset operation. The body microcomputer 50 waits for receiving reset termination information from the lens microcomputer 80 and the termination of a series of processings after the exposure. Thereafter, the body microcomputer 50 confirms that the release button 40b is not in a pressed state, and terminates a shooting sequence. Then, the process returns to Step St5, and the body microcomputer 50 remains in a standby state until the release button 40b is pressed halfway down.

When the power switch 40a is turned off (Step St22), the body microcomputer 50 shifts the focus lens group 72 to a predetermined reference position (Step St23), and puts the shutter unit 42 into a closed state (Step St24). Then, operation of the body microcomputer 50 and other units in the camera body 4, and the lens microcomputer 80 and other units in the interchangeable lens 7 is halted.

As has been described, in AF operation of this embodiment, first, defocus information is obtained by the phase difference detection unit 30, and the focus lens group 72 is driven based on the defocus information. Then, a position of the focus lens group 72 at which a contrast value calculated based on an output from the imaging device 1 reaches a peak is detected, and the focus lens group 72 is driven to the position. Thus, defocus information can be detected before driving the focus lens group 72, and therefore, unlike conventional contrast detection AF, the step of tentatively driving the focus lens group 72 is not necessary. This allows reduction in processing time for autofocusing. Moreover, an object image is brought in focus by contrast detection AF eventually, a contrast peak can be directly obtained, and thus, unlike phase difference detection AF, various correction operations such as release back correction (for correcting an out-of-focus state related to the degree of aperture) are not necessary, so that highly accurate focusing performance can be achieved. Particularly, an object having a repetitive pattern, and an object having extremely low contrast, etc. can be brought in focus with higher accuracy than in conventional phase difference detection AF.

Although the AF operation of this embodiment includes phase difference detection, photometry can be performed by the imaging device 1 in parallel to the step of obtaining defocus information by the phase difference detection unit 30. This is because defocus information is obtained by the phase difference detection unit 30 using light transmitted through the imaging device 1. That is, the phase difference detection unit 30 receives light transmitted through the imaging device 1 to obtain defocus information, and thus, whenever the phase difference detection unit 30 obtains defocus information, the imaging device 1 is irradiated with light from an object. Therefore, photometry is performed using light transmitted through the imaging device 1 in autofocusing. By doing the above-described operation, a photometry sensor does not have to be additionally provided, and photometry can be performed before the release button 40b is pressed all the way down, so that a time (hereinafter also referred to as a "release time lag") from a time point when the release button 40b is pressed all the way down to a time point when the exposure is terminated can be reduced.

Moreover, even in a configuration in which photometry is performed before the release button 40b is pressed all the way down, by performing photometry in parallel to autofocusing, increase in processing time after the release button 40b is pressed halfway down can be prevented. In such a case, a mirror for guiding light from an object to a photometry sensor or a phase difference detection unit does not have to be provided.

Conventionally, a part of light from an object to an imaging apparatus is guided to a phase difference detection unit provided outside the imaging apparatus by a mirror, etc. In contrast, according to this embodiment, a focus state can be detected by the phase difference detection unit 30 using light guided to the imaging unit U as it is, and thus, the focus state can be detected with very high accuracy.

Note that, in the above-described embodiment, hybrid AF in which after performing phase difference detection, contrast AF is performed is employed. However, the method employed in autofocusing is not limited thereto. For example, phase difference detection AF in which AF is performed based on defocus information obtained by phase difference detection may be employed. Also, autofocus may be performed by switching from one to another among the above-described hybrid AF, phase difference detection AF, and contrast detection AF in which phase difference detection is not performed and focusing is performed based on only a contrast value.

Therefore, according to this embodiment, a contrast peak can be detected using output signals of at least ones of the light receiving portions 12, 12, . . . of the first photoelectric conversion portion 10 corresponding to the white filters 16w, and thus, even in a low light intensity environment, e.g., in darkness, etc., a contrast peak can be detected with high sensitivity.

Image data, on the other hand, can be generated using output signals of ones of the light receiving portions 12, 12, . . . of the first photoelectric conversion portion 10 corresponding to the green and blue color filters 16g and 16b, and output signals of ones of the light receiving portions 22, 22, . . . of the second photoelectric conversion portion 20 receiving light from which infrared light is filtered, and thus, imaging with high color reproducibility can be performed.

Furthermore, image data can be generated using, in addition to the above-described output signals, output signals of ones of the light receiving portions 12, 12, . . . of the first photoelectric conversion portion 10 corresponding to the white filters 16w, and thus, image recognition in a low light intensity environment can be preformed.

As described above, the amount of infrared light and the amount of visible light can be obtained in parallel. Thus, both of imaging with high color reproducibility based on the amount of visible light can be performed, and also processing, such as contrast AF with high sensitivity, and image recognition, etc. in darkness, etc., by flexibly using infrared light can be performed.

The first photoelectric conversion portion 10 is configured so that light is transmitted therethrough, and the second filters 26 each of which functions as an IR cut filter and the second photoelectric conversion portion 20 are arranged in this order in the back of the first photoelectric conversion portion 10. Thus, the amount of infrared light and the amount of visible light can be obtained in parallel in a simple configuration. That is, there is no need to configure the imaging apparatus so that the position of the IR cut filter can be switched, in conjunction with the aperture portion 73, between an installation position in front of the imaging device 1 and an evacuation position, or to configured so that switching of the position of the IR filter between the installation position and the evacuation position is performed by some other mechanism.

Moreover, not only the first photoelectric conversion portion 10, but also the second photoelectric conversion portion 20 is configured so that light is transmitted through the second photoelectric conversion portion 20, and the phase difference detection unit 30 is provided in the back of the second photoelectric conversion portion 20. Thus, phase difference detection by the phase difference detection unit 30 can be performed while imaging by the imaging device 1 is performed.

Other Embodiments

In connection with the above-described embodiments, the following configurations may be employed.

Specifically, in the above-described embodiments, the light receiving portions 22, 22, . . . of the second photoelectric conversion portion 20 are configured so that each of the light receiving portions 22 has an area four times as large as the area of each of the light receiving portion 12. However, the area of the light receiving portion 22 is not limited thereto. The size of the light receiving portion 22 may be equal to, smaller than, or larger than the size of the light receiving portion 12.

Also, the configurations of the first filter 16 (216) and the second filter 26 are not limited to the configurations described in the above-described embodiments. For example, the first filters 16 may be all made of white filters, the first photoelectric conversion portion 10 may be configured to receive white light including infrared light, the second filters 26 may be made of primary color filters which are arranged in a Bayer array pattern and also functions as IR cut filters, and the second photoelectric conversion portion 20 may be configured to receive visible light from which infrared light is filtered. That is, any configuration in which at least some of pixels of the first photoelectric conversion portion 10 receive light including infrared light and at least some of pixels of the second photoelectric conversion portion 20 receive visible light from which infrared light is filtered may be employed.

Furthermore, the first imaging portion 1A and the second imaging portion 1B are stacked. However, a configuration in which the first imaging portion 1A and the second imaging portion 1B are physically separated may be employed.

Note that the above-described embodiments are essentially preferable examples which are illustrative and do not limit the present invention, its applications, and the scope of use of the invention.

INDUSTRIAL APPLICABILITY

As has been described, the present invention is useful particularly for an imaging device which receives light and performs photoelectric conversion and an imaging apparatus including the imaging device.

DESCRIPTION OF REFERENCE CHARACTERS 1, 201, 301 Imaging Device
10, 310 First Photoelectric conversion portion
11, 311 Substrate
12, 312 Light Receiving Portion
16, 216 First Filter (Color Filter)
16g Green Color Filter
16b Blue Color Filter
16w White Filter
20, 320 Second Photoelectric conversion portion
26 Second Filter (Infrared Cut Filter)
216r Red Color Filter
100 Camera (Imaging Apparatus)

The invention claimed is:

1. An imaging apparatus, comprising:
an imaging device which receives light, performs photoelectric conversion, and includes a first photoelectric conversion portion configured to receive light including infrared light and allow light to pass therethrough, and a second photoelectric conversion portion configured to receive light obtained by filtering out infrared light from the light which has passed through the first photoelectric conversion portion; and
a control section to which an output signal from the imaging device is input,
wherein the control section determines a focus state based on at least an output signal from the first photoelectric conversion portion, and generates image data based on at least an output signal from the second photoelectric conversion portion.

2. The imaging apparatus of claim 1, wherein the imaging device further comprises:
a plurality of color filters which are provided in front of the first photoelectric conversion portion and transmit light in different wavelength ranges; and
infrared cut filters provided in the back of the first photoelectric conversion portion, and in front of the second photoelectric conversion portion, and configured to filter out at least infrared light.

3. The imaging apparatus of claim 2, wherein
the plurality of color filters include at least green color filters each of which transmits light in a green wavelength range, blue color filters each of which transmits light in a blue wavelength range, and white color filters each of which transmits white light, and
the infrared cut filters are each configured to filter out infrared light and transmit light in a red wavelength range.

4. The imaging apparatus of claim 2, wherein
the plurality of color filters include at least red color filters each of which transmits light in a red wavelength range, green color filters each of which transmits light in a green wavelength range, and blue color filters each of which transmits light in a blue wavelength range.

5. The imaging apparatus of claim 1, wherein
each pixel of the second photoelectric conversion portion is larger than that of the first photoelectric conversion portion.

6. The imaging apparatus of claim 1, wherein
the first photoelectric conversion portion includes a substrate and light receiving portions provided in the substrate, and
the substrate is formed to have a thickness with which light is transmitted through the substrate.

7. The imaging apparatus of claim 1, further comprising:
a phase difference detection portion configured to perform phase difference detection, wherein:
the second photoelectric conversion portion is configured to allow light pass therethrough, and
the phase difference detection portion receives light which has passed through the second photoelectric conversion portion and performs phase difference detection.

* * * * *